United States Patent
Nishida et al.

(10) Patent No.: US 10,638,602 B2
(45) Date of Patent: Apr. 28, 2020

(54) IN-VEHICLE ELECTRONIC DEVICE

(71) Applicant: Mitsubishi Electric Corporation, Tokyo (JP)

(72) Inventors: Mitsunori Nishida, Tokyo (JP); Michihiro Takata, Tokyo (JP); Tomonori Kuriyama, Tokyo (JP); Keita Takahashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/244,566

(22) Filed: Jan. 10, 2019

(65) Prior Publication Data
US 2019/0223287 A1    Jul. 18, 2019

(30) Foreign Application Priority Data

Jan. 16, 2018 (JP) .................................. 2018-004708

(51) Int. Cl.
*H05K 1/02* (2006.01)
*H05K 1/11* (2006.01)
(Continued)

(52) U.S. Cl.
CPC .......... *H05K 1/0259* (2013.01); *B60R 16/06* (2013.01); *H05K 1/0215* (2013.01); *H05K 1/0231* (2013.01); *H05K 1/116* (2013.01); *H05K 1/181* (2013.01); *H05K 5/006* (2013.01); *H05K 5/0052* (2013.01); *H05K 5/0069* (2013.01);
(Continued)

(58) Field of Classification Search
CPC .. H05K 1/0259; H05K 9/0067; H05K 5/0069; H05K 5/061; H05K 1/116; H05K 1/181; H05K 5/0052; H05K 5/006; H05K 1/0215; H05K 1/0231; H05K 5/0073; H05K 2201/093; H05K 2201/09609;
(Continued)

(56) References Cited

U.S. PATENT DOCUMENTS

2006/0192509 A1* 8/2006 Nakakita ............... H02M 7/003
                                                        318/139
2007/0187137 A1* 8/2007 Isebo ..................... H01L 23/15
                                                        174/255
(Continued)

FOREIGN PATENT DOCUMENTS

JP        2009-248635 A    10/2009

*Primary Examiner* — Rockshana D Chowdhury
(74) *Attorney, Agent, or Firm* — Sughrue Mion, PLLC; Richard C. Turner

(57) ABSTRACT

A fourth layer outer frame protection pattern of a multilayer circuit board housed in a conductive base and a nonconductive cover is in contact with an inner surface of the base via a selection layer, and is connected to a second layer planar ground pattern via a coupling capacitor, outer peripheral portions of respective layer patterns including a first and third layer annular ground patterns are overlapped with each other, and the planar ground pattern is wire connected to a reference ground point of a vehicle body. When the base is conductively attached to the vehicle body, a selection layer is a solder resist film, and when it is non-conductively attached, the selection layer is a solder film, so that the planar ground pattern does not conduct with the base at the time of short circuit abnormality of the coupling capacitor.

9 Claims, 12 Drawing Sheets

(51) Int. Cl.
    *H05K 5/00*          (2006.01)
    *H05K 1/18*          (2006.01)
    *B60R 16/06*        (2006.01)
    *H05K 9/00*          (2006.01)
    *H05K 5/06*          (2006.01)

(52) U.S. Cl.
    CPC ........... *H05K 5/0073* (2013.01); *H05K 5/061* (2013.01); *H05K 9/0067* (2013.01); *H05K 2201/093* (2013.01); *H05K 2201/09609* (2013.01); *H05K 2201/10015* (2013.01); *H05K 2201/10022* (2013.01); *H05K 2201/10507* (2013.01)

(58) Field of Classification Search
    CPC .......... H05K 2201/10015; H05K 2201/10507; H05K 2201/10022; B60R 16/06
    See application file for complete search history.

(56) References Cited

U.S. PATENT DOCUMENTS

| | | | |
|---|---|---|---|
| 2011/0011633 A1* | 1/2011 | Uchida | B62D 5/0406 174/258 |
| 2013/0146352 A1* | 6/2013 | Lassmann | H05K 1/0201 174/548 |
| 2015/0108873 A1* | 4/2015 | Gerlach | B06B 1/0292 310/334 |
| 2016/0118719 A1* | 4/2016 | Shirley | H01Q 23/00 343/700 MS |

* cited by examiner

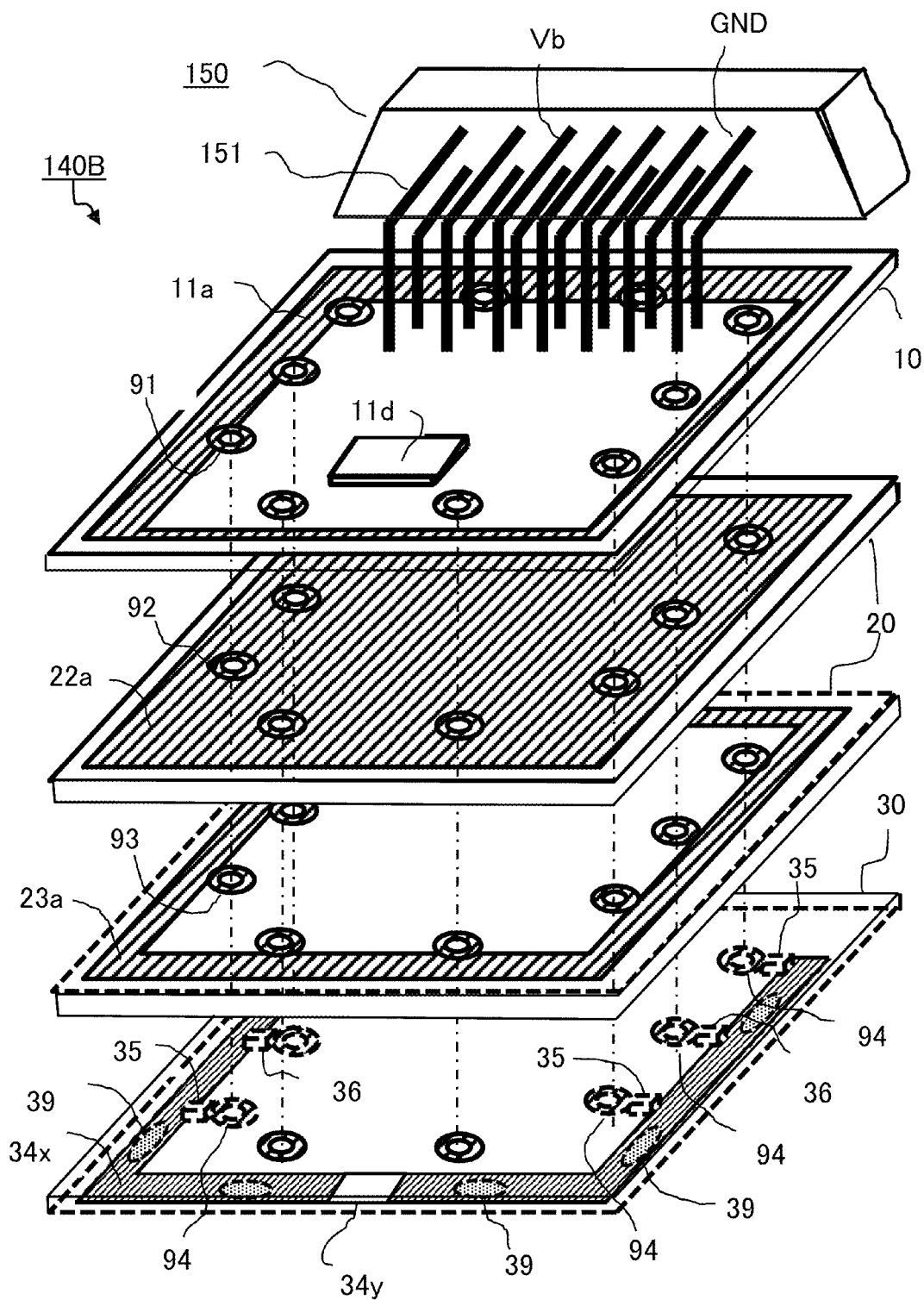

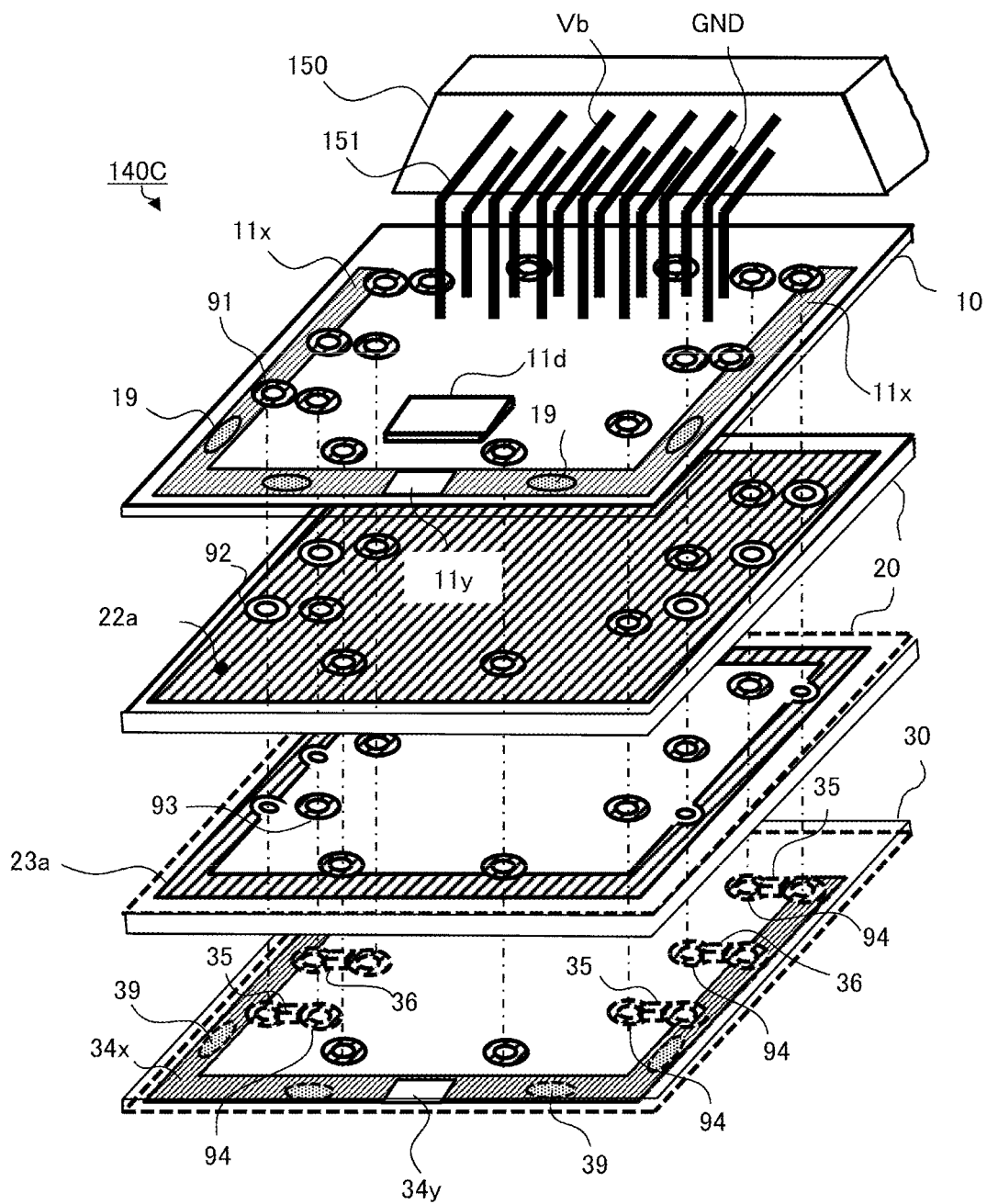

IN-VEHICLE ELECTRONIC DEVICE

BACKGROUND OF THE INVENTION

1. Technical Field

The present application relates to an in-vehicle electronic device, and more particularly to the in-vehicle electronic device housing a multilayer circuit board mounted with electronic components in a housing.

2. Background Art

The in-vehicle electronic device hermetically sandwiches and houses the circuit board in the housing constituted by a flat or deep bottom base member mounted and fixed to a vehicle body, and a flat or deep bottom cover member fastened and fixed to the base member. A connector housing is attached to the circuit board, an end surface of the connector housing is exposed from a side surface of the housing, and a connector is removably attached thereto so that a power supply line and an input/output signal line are connected to the connector. In this type of in-vehicle electronic device, electromagnetic interference is a major problem, and for example, in Patent Literature 1, in order to prevent an LSI and the like of the in-vehicle electronic device from malfunctioning due to static electricity or noise, a ground pattern is provided in an electronic substrate sandwiched by a metal base member and a cover member, the ground pattern is grounded to a conductive portion of the vehicle body via a connection terminal of the connector housing, and a protection pattern connected with a capacitor is disposed on an outer peripheral portion of the ground pattern, so that static electricity and noise are easily conducted to the protection pattern. Patent Literature 1 further proposes that a cut portion is provided in a portion facing an integrated circuit element (LSI) of the protection pattern, and the protection pattern is configured not to operate as a loop antenna, so that malfunction or breakage of the integrated circuit element can be prevented.

Further, the Patent Literature 1 discloses that the protection pattern is electrically conductively connected to the base member or AC-connected via a high dielectric body and DC-disconnected, to be a capacitor. That is, when the high dielectric body is used, the protection pattern is AC-connected to the base member via the high dielectric body, and the base member is attached to conduct to the vehicle body. Furthermore, the Patent Literature 1 discloses that the protection pattern is provided as an island-like protection pattern and brought into conductive contact with the base member.

CITATION LIST

Patent Literature

Patent Literature 1: JP-A-2009-248635

The in-vehicle electronic device according to the Patent Literature 1 is configured such that a belt-like protection pattern surrounding a planar ground pattern connected to the conductive portion of the vehicle body from a ground terminal of the connector via an external grounding wire is provided, the capacitor is connected between the protection pattern and the ground pattern, and noise entering from the metal base member via the protection pattern flows out to the conductive portion of the vehicle body via the capacitor, the ground terminal and the external grounding wire. However, it is difficult to absorb the noise entering from various places of a rectangular protection pattern with a single capacitor, and even if a plurality of capacitors is arranged in a distributed manner, there is a problem that it is difficult to remove high frequency noise due to influence of parasitic inductance included in the capacitor. Further, even if the base member is made of metal, there is for example a case where a mounting portion is a metal portion of the vehicle body or a resin material, or an insulating coating film is applied, and even if it is connected to the base member, there is a problem that it is not configured to easily deal with a difference in grounding conditions due to the subsequent portion depending on how to mount the base member. Furthermore, since the ground pattern is directly connected to two types of ground points having different potential levels via a base, there is a problem that common mode noise is generated.

SUMMARY OF INVENTION

An object of the present application is to solve the above problems to provide an in-vehicle electronic device capable of preventing malfunction of an electronic circuit and breakage of an electronic component with a small and inexpensive structure.

An in-vehicle electronic device according to the present application includes a conductive base including a mounting and fixing portion fixed to a mounting surface of a vehicle, a nonconductive or conductive cover integrated with the base by a fastening member, and a multilayer circuit board sandwiched between a shelf step portion provided inside the base and a sandwiching pressure contact portion provided inside the cover. An end surface of a connector housing mounted on a first side of the multilayer circuit board is disposed so as to be exposed from a housing constituted by the base and the cover. A plurality of connection terminals to which a power supply line and an input/output signal line are connected is press-fitted to the connector housing. The multilayer circuit board has at least first to fourth layer circuit patterns laminated via a plurality of insulating substrates, a first layer circuit pattern faces an inner surface of the cover, and a fourth layer circuit pattern faces an inner surface of the base. One or both of the first layer circuit pattern and the fourth layer circuit pattern serve as a mounting surface of a circuit component, and a wiring pattern between circuit components is provided thereon. A planar ground pattern connected to a vehicle body is provided in one of a second layer circuit pattern and a third layer circuit pattern via a ground terminal GND which is a part of the plurality of connection terminals.

An annular ground pattern connected to the planar ground pattern via a plurality of ground vias is provided in the other of the second layer circuit pattern and the third layer circuit pattern. In the fourth layer circuit pattern, one or a plurality of divided fourth layer outer frame protection patterns is provided in an entire area or a partial area of outer frame positions of four sides of the multilayer circuit board, or in an entire area or a partial area of outer frame positions of three sides other than the first side. The first layer circuit pattern includes a first layer annular ground pattern connected to the planar ground pattern via the plurality of ground vias, or includes a first layer outer frame protection pattern connected to the fourth layer outer frame protection pattern for three directions via a plurality of protection pattern connection vias. The fourth layer outer frame protection pattern or the first layer outer frame protection pattern is connected to the planar ground pattern via one or a plurality of coupling capacitors, and is in contact with the shelf step portion provided in the base or the sandwiching pressure contact portion provided in the cover via a nonconductive or conductive intervening layer which is a solder resist film or a solder film. Half or more than half of each of all pattern widths of the annular ground patterns and the outer frame protection patterns overlap an outer frame portion of the planar ground pattern.

As described above, in the in-vehicle electronic device according to the present application, the multilayered circuit board mounted with the connector housing is sandwiched and housed in the housing constituted by the base and the cover. The multilayer circuit board has a component mounting surface in which a first layer is on the cover side and a fourth layer is on the base side, and includes the planar ground pattern provided in one of a second layer and a third layer, the annular ground pattern provided in the other of the second layer and the third layer, the outer frame protection pattern provided in the fourth layer, and the annular ground pattern or the outer frame protection pattern provided in the first layer. The annular ground pattern and the outer frame protection pattern are overlapped face to face with each other with the outer frame portion of the planar ground pattern and the insulating substrate therebetween, the planar ground pattern is connected to the vehicle body to which a negative side power supply terminal of an in-vehicle battery is connected via the connection terminal provided in the connector housing, and the coupling capacitor is connected between the outer frame protection pattern and the planar ground pattern.

Therefore, the planar ground pattern, the annular ground pattern, and the outer frame protection pattern are layered in a sandwiching portion on the outer periphery of the substrate on which the components cannot be mounted, and since the mounted components and the wiring pattern for the mounted components are surrounded by the annular ground pattern, it is possible to allow the outer frame protection pattern and the planar ground pattern or the annular ground pattern to be closely opposed to each other in a wide area without widening the substrate area to increase a strip-like distributed electrostatic capacitance as a pseudo-electrostatic capacitance element, thereby preventing noise intrusion and emission in a relatively high frequency band among high frequency noises which are mediated by the conductive base. In contrast, there is an effect that among the high frequency noises mediated by the conductive base, the noise in a relatively low frequency band is shared and absorbed by the coupling capacitor connected between the outer frame protection pattern and the planar ground pattern.

In addition, since the fourth layer outer frame protection pattern faces and is in contact with the shelf step portion of the base via the nonconductive or conductive intervening layer, in the case of a first condition in which the conductive base is conductively attached to the vehicle body, by making the intervening layer a nonconductive solder resist film, when short circuit abnormality occurs in the coupling capacitor, there is an effect of preventing the base and the planar ground pattern from being connected, and circulating current from flowing through wiring paths having different ground potentials. On the other hand, in the case of a second condition in which the conductive base is attached to a nonconductive portion of the vehicle body, if the intervening layer is made to be a conductive solder film, the strip-like distributed electrostatic capacitance as the pseudo-electrostatic capacitance element is generated between the outer frame protection pattern and the base, so that there is an effect of preventing the noise intrusion and emission in the relatively high frequency band via the coupling capacitor connected between the outer frame protection pattern and the planar ground pattern. Therefore, it is possible to easily deal with a difference in various installation conditions by selecting the intervening layer, and in either case the outer frame protection pattern and the planar ground pattern are not directly connected, so that the planar ground pattern is not directly connected to the two types of ground points having different potential levels via the base, and there is an effect that generation of the common mode noise can be prevented.

The foregoing and other object, features, aspects, and advantages of the present application will become more apparent from the following detailed description of the present application when taken in conjunction with the accompanying drawings.

BRIEF DESCRIPTION OF DRAWINGS

FIG. 5 is an exploded perspective view of a circuit board shown in FIG. 4;

FIG. 8 is an exploded perspective view of a circuit board shown in FIG. 7;

DETAILED DESCRIPTION

Embodiment 1

Figure 1:
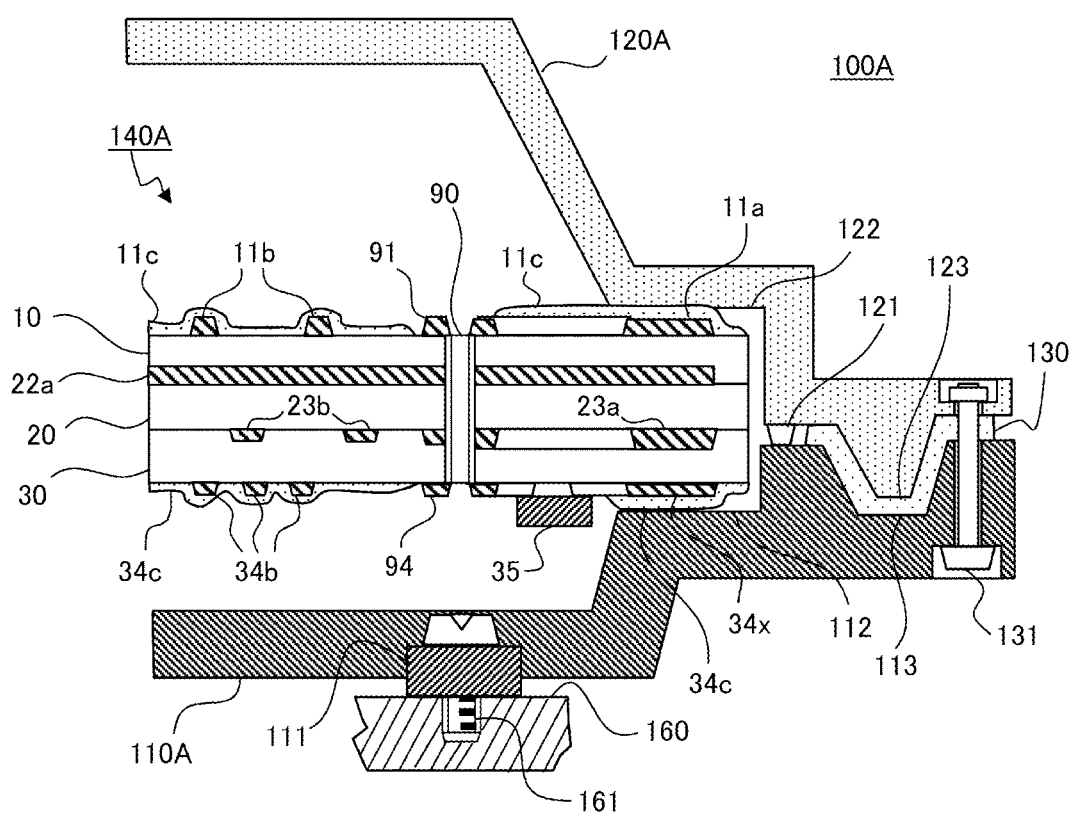
FIG. 1 is a partial cross-sectional view of an in-vehicle electronic device according to Embodiment 1.

Hereinafter, a configuration of an in-vehicle electronic device according to Embodiment 1 will be described in detail with reference to FIG. 1 which is a partial cross-sectional view of the in-vehicle electronic device and FIG. 2 which is an exploded perspective view of a circuit board of FIG. 1. In FIG. 1, an in-vehicle electronic device 100A includes a multilayer circuit board 140A hermetically housed in a housing constituted by a metal (conductive) base 110A and a resin (nonconductive) cover 120A, and a peripheral edge portion of the base 110A and the cover 120A are hermetically sealed by a waterproof sealing material 130. A mounting and fixing portion 111 is integrated, for example, at four corners of the base 110A, and the mounting and fixing portion 111 is, for example, installed with a screw to a mounting surface 160 on the vehicle body side using a mounting member 161. A shelf step portion 112 is provided on outer frame three sides of the base 110A, the multilayer circuit board 140A is mounted thereon, and a fitting recessed strip portion 113 to which the sealing material 130 is applied is provided on outer peripheral four sides.

The outer frame three sides are remaining three sides excluding a first side with a mounting side of a connector housing 150 described later in FIG. 2 as the first side, and an outer peripheral one side (a long bottom side of a trapezoidal shape in FIG. 2) of the connector housing 150 is fitted to the first side out of the outer peripheral four sides of the base 110A. The cover 120A is opposed to the base 110A via a plurality of gap regulating protrusions 121, and a sandwiching pressure contact portion 122 is provided on outer frame three sides of the cover 120A, so that the multilayer circuit board 140A is sandwiched between the shelf step portion 112 of the base 110A and the sandwiching pressure contact portion 122. Further, a fitting protruded strip portion 123 is provided on the outer frame three sides of the cover 120 A, and the fitting protruded strip portion 123 is fitted to the fitting recessed strip portion 113 of the base 110A, so that a sealing gap for the waterproof sealing material 130 is formed. An opening (not shown) through which an end surface of the connector housing 150 is exposed is provided on a first side of outer peripheral four sides of the cover 120A, outer peripheral four sides of the connector housing 150 are hermetically sealed via a waterproof seal (not shown) between the cover 120A and the base 110A, and the base 110A and the cover 120A are screwed and fastened to each other by a fastening member 131.

The opening of the first side of the cover 120A forms a trapezoidal shape and forms a convex-concave sealing surface between a trapezoidal top side portion and left and right oblique side portions of the connector housing 150, and a trapezoidal bottom side portion of the connector housing 150 forms a convex-concave sealing surface with the first side of the base 110A. The multilayer circuit board 140A is formed by laminating an upper layer substrate 10 having a first layer circuit pattern opposed to an inner surface of the cover 120A, a middle layer substrate 20 having a second layer circuit pattern and a third layer circuit pattern, and a lower layer substrate 30 having a fourth layer circuit pattern opposed to an inner surface of the base 110A, and the first layer surface and the fourth layer surface serve as mounting surfaces for circuit components. As the first layer circuit pattern, there are an annular ground pattern 11a and a plurality of signal patterns 11b for performing signal wiring and power supply wiring, and a solder resist film 11c is provided in these circuit patterns excluding solder portions. As the second layer circuit pattern, a planar ground pattern 22a is formed on an entire surface thereof excluding a through-hole plating hole portion.

As the third layer circuit pattern, there are an annular ground pattern 23a and a plurality of signal patterns 23b for performing signal wiring and power supply wiring. As the fourth layer circuit pattern, there are an outer frame protection pattern 34x and a plurality of signal patterns 34b for performing signal wiring and power supply wiring, and a solder resist film 34c is provided in these circuit patterns excluding solder portions. A ground via 90 connects via lands 91 to 94 provided in the respective layers by through-hole plating, whereby the annular ground patterns 11a, 23a and the planar ground pattern 22a are connected to each other. A coupling capacitor 35 is connected between the outer frame protection pattern 34x and the fourth layer via land 94, and as a result, the outer frame protection pattern 34x and the planar ground pattern 22a are AC-connected by the coupling capacitor 35.

Figure 2:
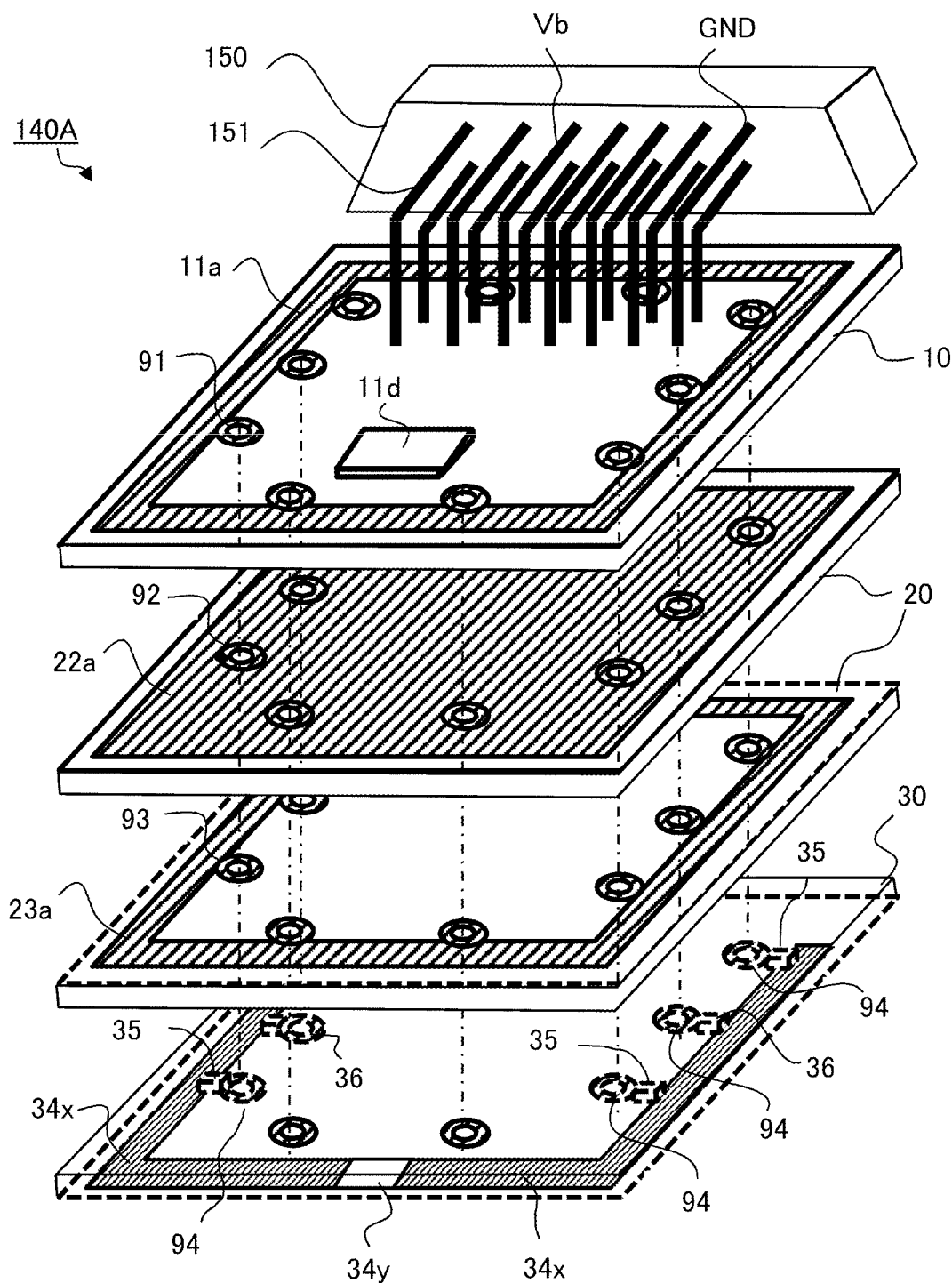
FIG. 2 is an exploded perspective view of a circuit board shown in FIG. 1.

In FIG. 2, the resin connector housing 150 has a trapezoidal end surface, its long bottom side is opposed to the first side of the base 110A via the convex-concave sealing surface, remaining short top side and left and right oblique sides are opposed to the opening provided on the first side of the cover 120A via the convex-concave sealing surface, and the waterproof sealing material 130 (see FIG. 1) is applied to these convex-concave sealing surfaces. A plurality of connection terminals 151 press-fitted and held in a partition wall of the connector housing 150 is connected to various input sensors and electric loads mounted on a vehicle via a wire harness and a connector (not shown) which are attached to the connector housing 150 so as to be freely inserted and removed. Although not shown, a positive side power supply terminal VB which is a part of the connection terminal 151 is connected to a positive electrode terminal of an in-vehicle battery via a power switch, and a negative side power supply terminal GND which is another part of the connection terminal 151 is connected to a reference ground point GND0 (see FIG. 3A) on the vehicle body side provided in the vicinity of the vehicle body to which a negative electrode terminal of the in-vehicle battery is connected.

The connection terminals 151 penetrate the first and second layer circuit patterns of the multilayer circuit board 140A, and are selectively conductively connected to the circuit pattern of the required layer. The via land 91 connected to the annular ground pattern 11a provided on a surface of the upper layer substrate 10, the via land 92 which is a part of the planar ground pattern 22a provided on a surface of the middle layer substrate 20, the via land 93 connected to the annular ground pattern 23a provided on a back surface of the middle layer substrate 20, and the via land 94 separated and arranged in the vicinity of the outer frame protection pattern 34x provided on a back surface of the lower layer substrate 30 are conductively connected to each other by the ground via 90 (see FIG. 1). An integrated circuit element 11d including a microprocessor (not shown), and another circuit component (not shown) are mounted on the surface of the upper layer substrate 10. The outer frame protection pattern 34x divided into two by a cutout portion 34y, the coupling capacitor 35 connected between the outer frame protection pattern 34x and the fourth layer via land 94, and a discharge resistance 36 of, for example, 1 MΩ are mounted on the back surface of the lower layer substrate 30.

When a frequency of a noise source to be reduced is, for example, 100 MHz, it is desirable to set an arrangement interval of the coupling capacitors 35 at an interval of one tenth or less of a wavelength $\lambda$=1.37 m. The number of discharge resistances 36 only has to be one for each of division units of the outer frame protection pattern 34x. A break interval of the outer frame protection pattern 34x by the cutout portion 34y is provided when the arrangement interval between the outer frame protection pattern 34x and the integrated circuit element 11d is narrow, and is preferably equal to or more than a pattern width of the outer frame protection pattern 34*x*. A heat generating component such as a power transistor (not shown) is mounted on the back surface of the lower layer substrate 30. The heat generating component is configured to be joined to the base 110A via a heat transfer material.

Figure 3A:
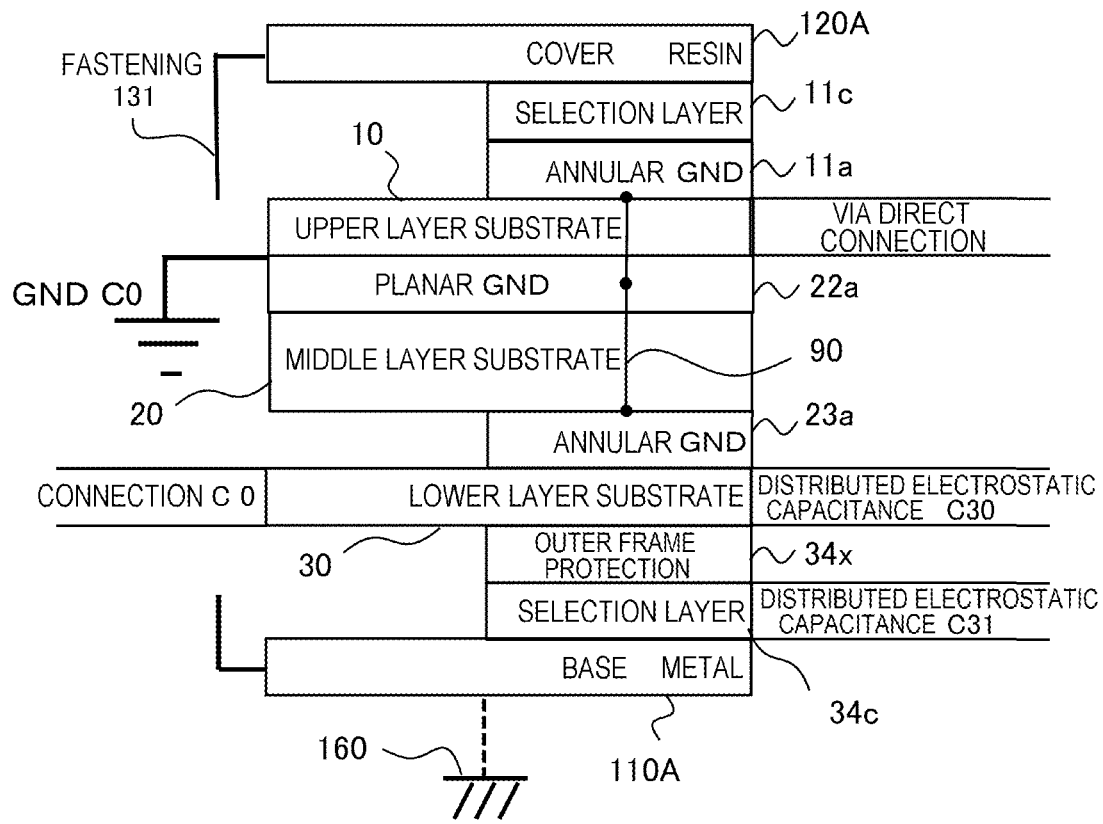
FIG. 3A is a layered configuration diagram of the circuit board shown in FIG. 1.

Next, action and operation of the in-vehicle electronic device 100A according to Embodiment 1 configured as shown in FIGS. 1 and 2 will be described in detail with reference to FIG. 3A which is a layered configuration diagram of the circuit board of the in-vehicle electronic device of FIG. 1, and FIG. 3B which is a connection circuit diagram of a capacitor at the time of conductive mounting (mounting in a state of electrically low resistance connection) of the in-vehicle electronic device of FIG. 1. In FIG. 3A, the planar ground pattern 22*a* provided on the upper surface of the middle layer substrate 20 is connected to the reference ground point GND0 to which the negative electrode terminal of the in-vehicle battery is connected via a ground terminal GND of the connector housing 150. The annular ground pattern 11*a* of a surface layer provided in the upper layer substrate 10 and the annular ground pattern 23*a* provided on the lower surface of the middle layer substrate 20 are conductively connected to the planar ground pattern 22*a* via the ground via 90. The inner surface of the resin cover 120A is in contact with the annular ground pattern 11*a* via the solder resist film 11*c*, and the cover 120A is fixed to the base 110A via the conductive fastening member 131.

The metal base 110A is conductively attached to a conductive member of the vehicle body via the mounting surface 160, however, a potential difference is generated between a potential of a mounting portion and the reference ground point GND0. Causes of the potential difference are a DC component determined by the product of the current flowing there and the connection resistance, and a noise component due to high frequency noise current and an inductance component of connection wiring. In addition, the potential difference also occurs between the planar ground pattern 22*a* and the reference ground point GND0, and a problem is the potential difference due to the high frequency noise component. A radiation noise in the in-vehicle electronic device mainly relates to a wire harness stretched in the vehicle, and a radiation noise from one side to the other side of a bundled wire and the radiation noise acting on the metal housing from the wire harness occupy the majority. Therefore, it is the greatest problem to reduce high-frequency noise generated between the metal base (or the metal cover) and the planar ground pattern as a housing structure of the in-vehicle electronic device, and between the metal base 110A and the planar ground pattern 22*a*, the annular ground pattern 23*a* and the outer frame protection pattern 34*x* provided on the back surface of the lower layer substrate 30 are provided.

The solder resist film 34*c* is applied to the outer frame protection pattern 34*x* as a selection layer so that the base 110A conductively attached to the vehicle body and the outer frame protection pattern 34*x* do not make conductive contact. On the other hand, a parallel circuit of the coupling capacitor 35 and the discharge resistance 36 is connected between the outer frame protection pattern 34*x* and the planar ground pattern 22*a* via the annular ground pattern 23*a*. Distributed electrostatic capacitance C30 is generated between the outer frame protection pattern 34*x* and the annular ground pattern 23*a* facing each other at their strip-like surfaces via the lower layer substrate 30. Similarly, distributed electrostatic capacitance C31 is generated between the outer frame protection pattern 34*x* and the shelf step portion 112 of the base 110A facing each other at their strip-like surfaces via the solder resist film 34*c*.

Figure 3B:
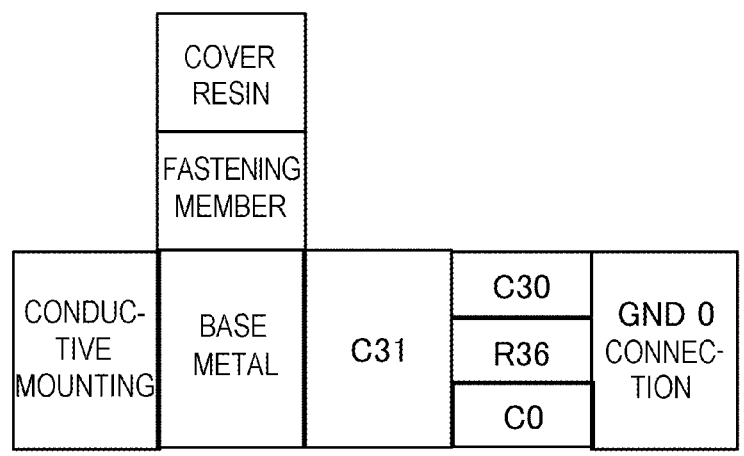
FIG. 3B is a connection circuit diagram of a capacitor at the time of conductive mounting according to Embodiment 1 shown in FIG. 1.

In FIG. 3B, between the metal base 110A conductively attached to the vehicle body and the planar ground pattern 22*a* connected to the reference ground point GND0, the distributed electrostatic capacitance C31 connected in series to a parallel circuit of a capacitor made of the coupling capacitors 35 having a total electrostatic capacitance C0, a discharge resistance R36, and the distributed electrostatic capacitance C30 is disposed. In this way, when the metal base is conductively attached to the vehicle body, by making it nonconductive between the base and the outer frame protection pattern by the solder resist film, the base and the planar ground pattern are prevented from being connected to each other, when the short circuit abnormality occurs in the coupling capacitor, so as to prevent circulating current from flowing through wiring paths having different ground potentials.

As is apparent from the above description, the in-vehicle electronic device 100A according to Embodiment 1 includes the metal base 110A including the mounting and fixing portion 111 fixed to the mounting surface 160 of the vehicle, the resin cover 120A integrated with the base 110A by the fastening member 131, and the multilayer circuit board 140A sandwiched between the shelf step portion 112 provided inside the base 110A and the sandwiching pressure contact portion 122 provided inside the cover 120A. In the in-vehicle electronic device 100A, the end surface of the connector housing 150 mounted on the first side of the multilayer circuit board 140A is disposed so as to be exposed from the housing constituted by the base 110A and the cover 120A, and the plurality of connection terminals 151 to which a power supply line and an input/output signal line are connected is press-fitted to the connector housing 150. The multilayer circuit board 140A has the first to the fourth layer circuit patterns laminated via a plurality of insulating substrates, the first layer circuit pattern faces the inner surface of the cover 120A, the fourth layer circuit pattern faces the inner surface of the base 110A, both the first layer circuit pattern and the fourth layer circuit pattern serve as the mounting surfaces for the circuit components, and the wiring patterns between the circuit components are provided thereon. The planar ground pattern 22*a* connected to the reference ground point GND0 of the vehicle body via the ground terminal GND which is the part of the plurality of connection terminals 151 is provided in the second layer circuit pattern.

The annular ground pattern 23*a* connected to the planar ground pattern 22*a* via the plurality of ground vias 90 is provided in the third layer circuit pattern. In the fourth layer circuit pattern, one or a plurality of divided fourth layer outer frame protection patterns 34*x* is provided in the entire area or the partial area of outer frame positions of the four sides of the multilayer circuit board 140A, or in the entire area or the partial area of the outer frame positions of the remaining three sides other than the first side. The first layer circuit pattern includes the first layer annular ground pattern 11*a* connected to the planar ground pattern 22*a* via the plurality of ground vias 90. The fourth layer outer frame protection pattern 34*x* is connected to the planar ground pattern 22*a* via one or a plurality of coupling capacitors 35, and is in contact with the shelf step portion 112 provided in the base 110A via the nonconductive intervening layer which is the solder resist film 34*c*. Half or more than half of each of all pattern widths of the annular ground patterns 11*a*, 23a and the outer frame protection pattern 34x three-dimensionally overlap the outer frame portion of the planar ground pattern 22a.

In the above description, the planar ground pattern and the annular ground pattern are provided as the second layer and the third layer circuit pattern, but they may be reversed to be the third layer and the second layer circuit pattern. However, in general, the planar ground pattern is provided adjacent to the mounting surface of the integrated circuit element including the microprocessor, so as to improve noise resistance. In the above description, the multilayer circuit board 140A is described as a four-layer circuit board, however, it is also possible to use two middle layer substrates between the upper layer substrate 10 constituting the first layer circuit pattern as the surface layer pattern and the lower layer substrate 30 constituting the fourth layer circuit pattern as aback surface layer pattern, to make a six-layer circuit board having four surface middle layer patterns, the surface layer and the back surface layer patterns. Thus, it is possible to perform processing such as improvement in component mounting density, increase in signal line pattern accompanying this, and integrated arrangement of various power supply line patterns in additional layers. This is the same for Embodiments 2 to 4, and if the first layer circuit pattern is replaced with the surface layer circuit pattern, the fourth layer circuit pattern is replaced with the back surface layer circuit pattern, and the second layer and the third layer circuit patterns are replaced with the middle layer circuit patterns, the circuit board corresponds to the six-layer circuit board.

The cover 120A is a cover made of a nonconductive resin, the first layer circuit pattern includes the first layer annular ground pattern 11a connected to the planar ground pattern 22a via the plurality of ground vias 90, and the annular ground pattern 11a is in contact with the sandwiching pressure contact portion 122 of the cover 120A via the solder resist film 11c.

As described above, in relation to a second aspect, the first layer annular ground pattern is in contact with the sandwiching pressure contact portion of the resin cover via the solder resist film. Therefore, even when the metal base is attached and fixed to the conductive portion of the vehicle body, the planar and annular ground pattern and the base or the cover are not directly conductively connected, and it is not directly connected to different ground potential portions with respect to a reference potential connected to the vehicle body via the ground terminal GND which is a part of the plurality of connection terminals in the connector housing. Even if the base potential is different from the reference potential, the base is connected to the ground pattern from the fourth layer protection pattern via the coupling capacitor, and the common mode high frequency noise is removed by the coupling capacitor. When a large heat-generating component is not mounted on a back surface of the cover, it is advantageous to use the resin cover which is not affected by electromagnetic induction noise and is made lighter than the metal cover. This is the same for Embodiments 2 and 4.

The outer frame protection pattern 34x provided in the fourth layer is provided at three outer peripheral positions of the multilayer circuit board 140A excluding a mounting position of the connector housing 150. The plurality of coupling capacitors 35 connected between the outer frame protection pattern 34x and the planar ground pattern 22a are provided in the fourth layer circuit pattern. The arrangement interval when all the coupling capacitors 35 are projected is a pitch of one tenth or less of the wavelength λ of the high frequency noise to be reduced.

As described above, in relation to a fourth aspect, the plurality of coupling capacitors is connected between the outer frame protection pattern and the planar ground pattern at intervals of one tenth or less of the wavelength λ of the high frequency noise to be reduced. Therefore, regardless of whether amounting state of the base and the cover is conductive with the vehicle body, it is possible to prevent the intruded or emitted noise from resonating in the metal base. This is the same for Embodiments 2 to 4, and in the case of Embodiment 3, the outer frame protection pattern is provided in the fourth layer and the first layer, and resonance of high frequency noise in the metal cover is prevented.

The discharge resistance 36 is connected in parallel to the coupling capacitor 35 connected between the outer frame protection pattern 34x provided in the fourth layer and the planar ground pattern 22a. As described above, in relation to a fifth aspect, a discharge resistance is connected in parallel to the coupling capacitor. Therefore, the coupling capacitor is not charged at high voltage by static electricity charged on the base, and a charged electric charge is always discharged to the vehicle body via the outer frame protection pattern, the discharge resistance, the planar ground pattern, and the negative side power supply terminal GND among the connection terminals inside the connector housing. This is the same for Embodiments 2 to 4, and in the case of Embodiment 3, the outer frame protection pattern is provided in the fourth layer and the first layer, so that high voltage charge of the coupling capacitor by the static electricity charged on the cover is also prevented.

The planar ground pattern 22a, the annular ground patterns 11a, 23a, and the via land connecting one electrode terminal of the plurality of coupling capacitors 35 are connected to each other via the plurality of ground vias 90, and the other electrode terminal of the plurality of coupling capacitors 35 is connected to the outer frame protection pattern 34x in the fourth layer. As described above, in relation to a sixth aspect, the planar ground pattern, the annular ground pattern and one electrode terminal of the coupling capacitor are connected to each other via a common ground via. Therefore, the number of ground vias can be reduced to enable high-density mounting of the circuit board. This is the same for Embodiments 2 to 4, and in the case of Embodiment 3, the outer frame protection patterns are provided in the fourth layer and the first layer.

The integrated circuit element 11d including the microprocessor is mounted and connected to the first layer circuit pattern, and the planar ground pattern 22a is constituted by the second layer circuit pattern adjacent to the mounting surface of the integrated circuit element 11d. The fourth layer or the first layer cutout portion 34y is provided and divided at a position where the fourth layer or the first layer outer frame protection pattern 34x approaches the integrated circuit element 11d. At least one of the coupling capacitors 35 is connected between the planar ground pattern 22a and the outer frame protection pattern 34x for each of the division units of the outer frame protection pattern 34x, and at least one of the discharge resistances 36 is connected in parallel with the coupling capacitor 35 for each of the division units. When the arrangement interval between the outer frame protection pattern 34x and the integrated circuit element 11d is equal to or less than the pattern width of the outer frame protection pattern 34x, the break interval of the outer frame protection pattern 34x by the cutout portion 34y is a dimension equal to or more than the pattern width of the outer frame protection pattern 34x.

As described above, in relation to a seventh aspect, when the arrangement interval between the integrated circuit element mounted on the first layer and the outer frame protection pattern is equal to or less than the pattern width of the outer frame protection pattern, the outer frame protection pattern is provided with the cutout portion. The breakage interval of the outer frame protection pattern by the cutout portion is equal to or larger than the pattern width of the outer frame protection pattern, and at least one coupling capacitor and discharge resistance are connected to the outer frame protection pattern for each of the division units. Therefore, it is possible to reduce electrostatic coupling between the outer frame protection pattern and the ground pattern in the vicinity of the integrated circuit element, thereby preventing the high frequency noise superimposed on the outer frame protection pattern and the high voltage in an electrostatic resistance test from intruding into the integrated circuit element including the microprocessor. This is the same for Embodiments 2 to 4, and in the case of Embodiment 3, the outer frame protection patterns are provided in the fourth layer and the first layer.

The second layer circuit pattern and the third layer circuit pattern are formed on both sides of the middle layer substrate 20, and the middle layer substrate 20 is the insulating substrate having a thickness dimension for securing a substrate strength. The first layer circuit pattern and the fourth layer circuit pattern are respectively formed on the surface of the upper layer substrate 10 and the back surface of the lower layer substrate 30, and thickness dimensions of the upper layer substrate 10 and the lower layer substrate 30 are each one half or less of that of the middle layer substrate 20.

As described above, in relation to the eighth aspect, the multilayer circuit board is made of the thick-plate middle layer substrate having the second layer circuit pattern and the third layer circuit pattern, and the thin-plate upper layer substrate and lower layer substrate each having the first layer circuit pattern and the fourth layer circuit pattern. Therefore, it is possible to increase a value of the strip-like distributed electrostatic capacitance as the pseudo-electrostatic capacitance element generated on facing surfaces of the fourth layer outer frame protection pattern and the third layer annular ground pattern. In a case where the multilayer circuit board is a six-layer substrate, the dimensions of the lower layer substrate and the upper layer substrate constituting the back surface layer or the surface layer on which the outer frame protection pattern is provided may be reduced in dimension. This is the same for Embodiments 2 to 4, and in the case of Embodiment 3, the outer frame protection patterns are provided in the fourth layer and the first layer.

Embodiment 2

Figure 4:
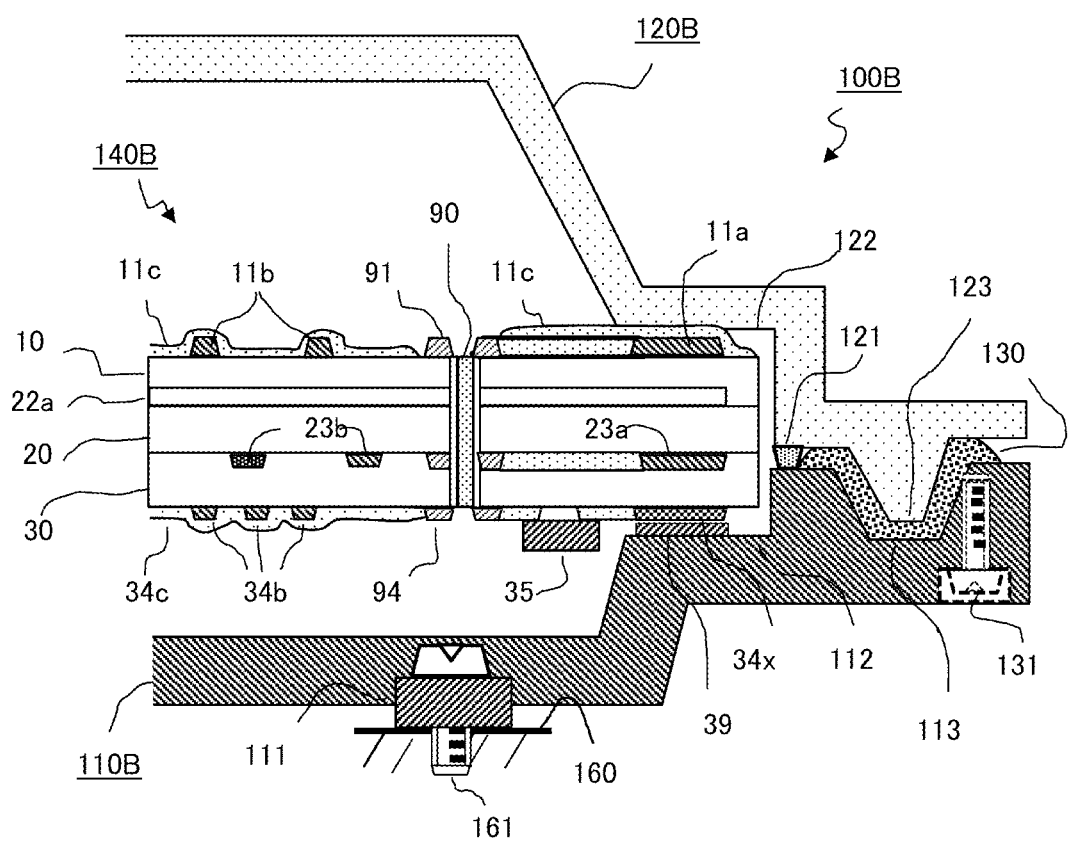
FIG. 4 is a partial cross-sectional view of an in-vehicle electronic device according to Embodiment 2.

The configuration according to Embodiment 2 of the in-vehicle electronic device will be described in detail with reference to FIG. 4 which is a partial cross-sectional view and FIG. 5 which is an exploded perspective view of the circuit board shown in FIG. 4 focusing on differences with that in FIG. 1 and FIG. 2. In the drawings, the same reference numerals denote the same or corresponding parts, the in-vehicle electronic device 100A is replaced with an in-vehicle electronic device 100B, and Embodiments are classified with capital letters at ends of the reference numerals. In FIGS. 4 and 5, a main difference with FIG. 1 and FIG. 2 is that the mounting surface 160 of the base 110A and a base 110B is a conductor or an insulator, and thus the selection layer for the outer frame protection pattern 34x is changed from the solder resist film 34c (in the case of the base 110A) to a solder film 39 (in the case of the base 110B). However, actually as shown in FIG. 5, the solder films 39 are distributedly provided at a plurality of portions of the outer frame protection pattern 34x, and the solder resist film as a rustproofing treatment is applied to portions other than the solder film 39.

Figure 6A:
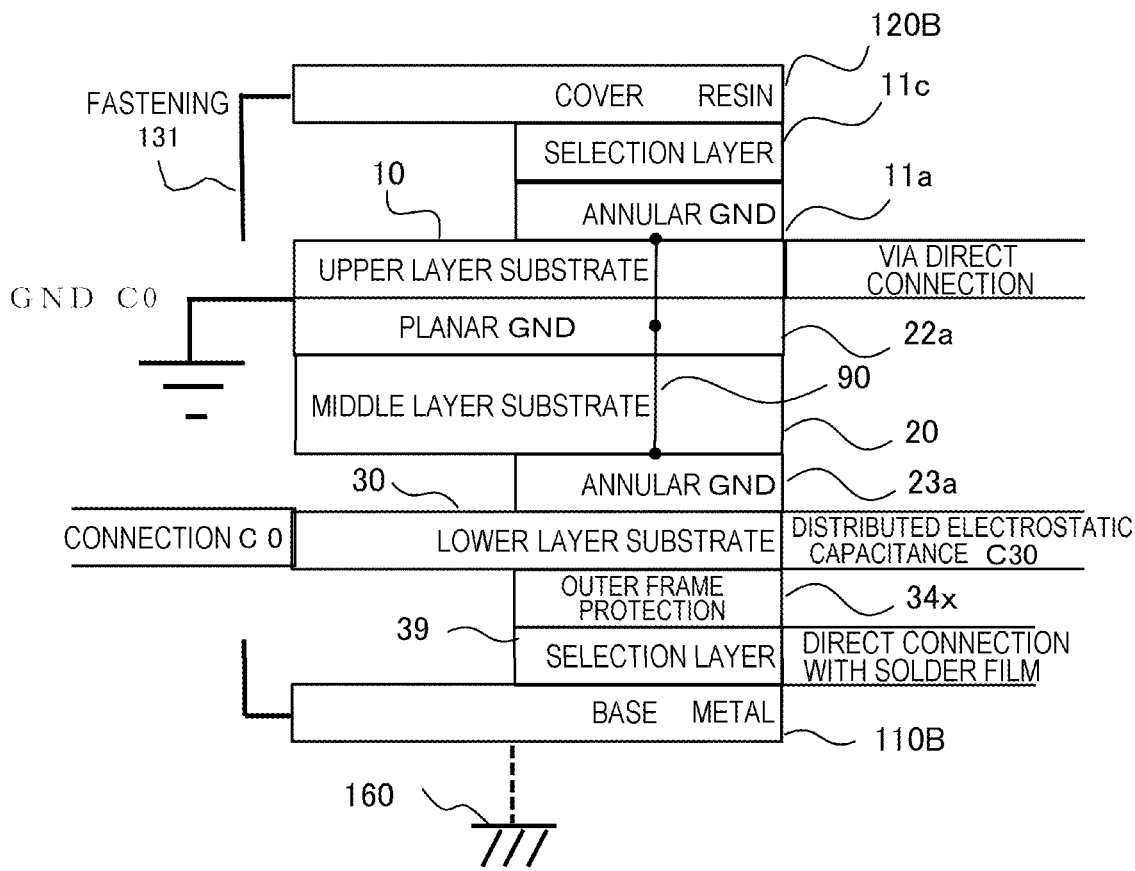
FIG. 6A is a layered configuration diagram of the circuit board shown in FIG. 4.
Figure 6B:
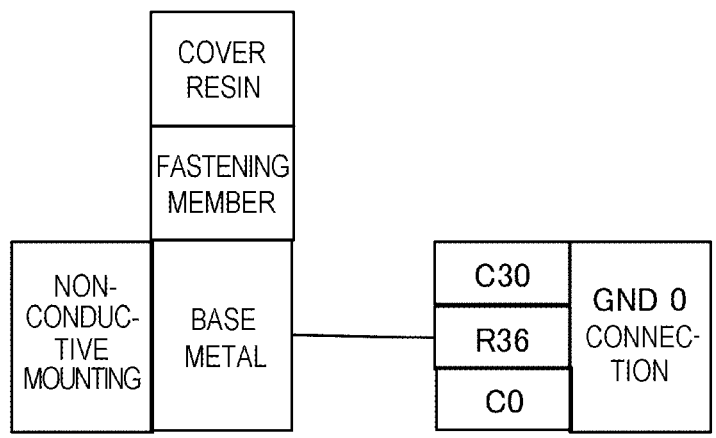
FIG. 6B is a connection circuit diagram of a capacitor at the time of nonconductive mounting according to Embodiment 2 shown in FIG. 4.

Next, with respect to FIG. 6A which is a laminated configuration diagram of the circuit board of the in-vehicle electronic device of FIG. 4 and FIG. 6B which is a connection circuit diagram of the capacitor at the time of nonconductive mounting (mounting in a state of electrically high resistance connection) of the in-vehicle electronic device of FIG. 4, the action and operation of the in-vehicle electronic device will be described in detail focusing on the differences with FIG. 3A and FIG. 3B. In FIGS. 6A and 6B, a metal base 110B is attached to the mounting surface 160 via the insulator such as insulation coating or a resin molding material. The outer frame protection pattern 34x provided on the back surface of the lower layer substrate 30 is in contact with the shelf step portion 112 of the base 110B via the solder film 39 as the selection layer. Therefore, a potential of the metal base 110B non-conductively attached to the vehicle body is stabilized by a potential of the outer frame protection pattern 34x without being influenced by the potential of the mounting portion. The potential of the outer frame protection pattern 34x is prevented from variation by the parallel circuit of the total electrostatic capacitance C0 of the coupling capacitors 35, a lower layer protection distributed electrostatic capacitance C30, and the discharge resistance R36, which are connected between the base and the planar ground pattern 22a.

As is apparent from the above description, the in-vehicle electronic device 100B according to Embodiment 2 includes the metal base 110B including the mounting and fixing portion 111 fixed to the mounting surface 160 of the vehicle, a resin cover 120B integrated with the base 110B by the fastening member 131, and a multilayer circuit board 140B sandwiched between the shelf step portion 112 provided inside the base 110B and the sandwiching pressure contact portion 122 provided inside the cover 120B. In the in-vehicle electronic device 100B, the end surface of the connector housing 150 mounted on the first side of the multilayer circuit board 140B is disposed so as to be exposed from the housing constituted by the base 110B and the cover 120B, and the plurality of connection terminals 151 to which the power supply line and the input/output signal line are connected is press-fitted to the connector housing 150. The multilayer circuit board 140B has the first to the fourth layer circuit patterns laminated via the plurality of insulating substrates, the first layer circuit pattern faces the inner surface of the cover 120B, the fourth layer circuit pattern faces the inner surface of the base 110B, both the first layer circuit pattern and the fourth layer circuit pattern serve as the mounting surfaces for the circuit components, and the wiring patterns between the circuit components are provided thereon. The planar ground pattern 22a connected to the reference ground point GND0 of the vehicle body via the ground terminal GND which is the part of the plurality of connection terminals 151 is provided in the second layer circuit pattern.

The annular ground pattern 23a connected to the planar ground pattern 22a via the plurality of ground vias 90 is provided in the third layer circuit pattern. In the fourth layer circuit pattern, one or a plurality of divided fourth layer outer frame protection patterns 34x is provided in the entire area or the partial area of outer frame positions of the four sides of the multilayer circuit board 140B, or in the entire area or the partial area of the outer frame positions of the three sides other than the first side. The first layer circuit pattern includes the first layer annular ground pattern 11a connected to the planar ground pattern 22a via the plurality of ground vias 90. The fourth layer outer frame protection pattern 34x is connected to the planar ground pattern 22a via one or a plurality of coupling capacitors 35, and is in contact with the shelf step portion 112 provided in the base 110B via the conductive intervening layer which is the solder film 39. Half or more than half of each of all pattern widths of the annular ground patterns 11a, 23a and the outer frame protection pattern 34x three-dimensionally overlap the outer frame portion of the planar ground pattern 22a.

In the case of Embodiment 1, since the outer frame protection pattern of the fourth layer is facing and is in contact with the shelf step portion of the base via the nonconductive intervening layer, when the metal base is conductively attached to the vehicle body, by making the intervening layer the nonconductive solder resist film, the base and the planar ground pattern are prevented from being connected, when the short circuit abnormality occurs in the coupling capacitor, so as to prevent the circulating current from flowing through the wiring paths having different ground potentials. In contrast, in the case of Embodiment 2, since the metal base is attached to the nonconductive portion of the vehicle body, if the intervening layer is made to be the conductive solder film, the strip-like distributed electrostatic capacitance as the pseudo-electrostatic capacitance element is generated between the outer frame protection pattern and the base, so that it is possible to prevent the noise intrusion and emission in the relatively high frequency band via the coupling capacitor connected between the outer frame protection pattern and the planar ground pattern. However, even in a case where the metal base is attached to the nonconductive portion of the vehicle body, it is also possible not to use the solder film 39 but to use the solder resist film 34c as the selection layer. In this case, the potential of the metal base is determined by the distributed electrostatic capacitance $C_{31}$ connected in series to the parallel circuit of the capacitor made of the coupling capacitors 35 having the total electrostatic capacitance $C_0$, the discharge resistance $R_{36}$, and the distributed electrostatic capacitance $C_{30}$, which are connected between the base and the planar ground pattern 22a connected to the reference ground point GND0.

Embodiment 3

Figure 7:
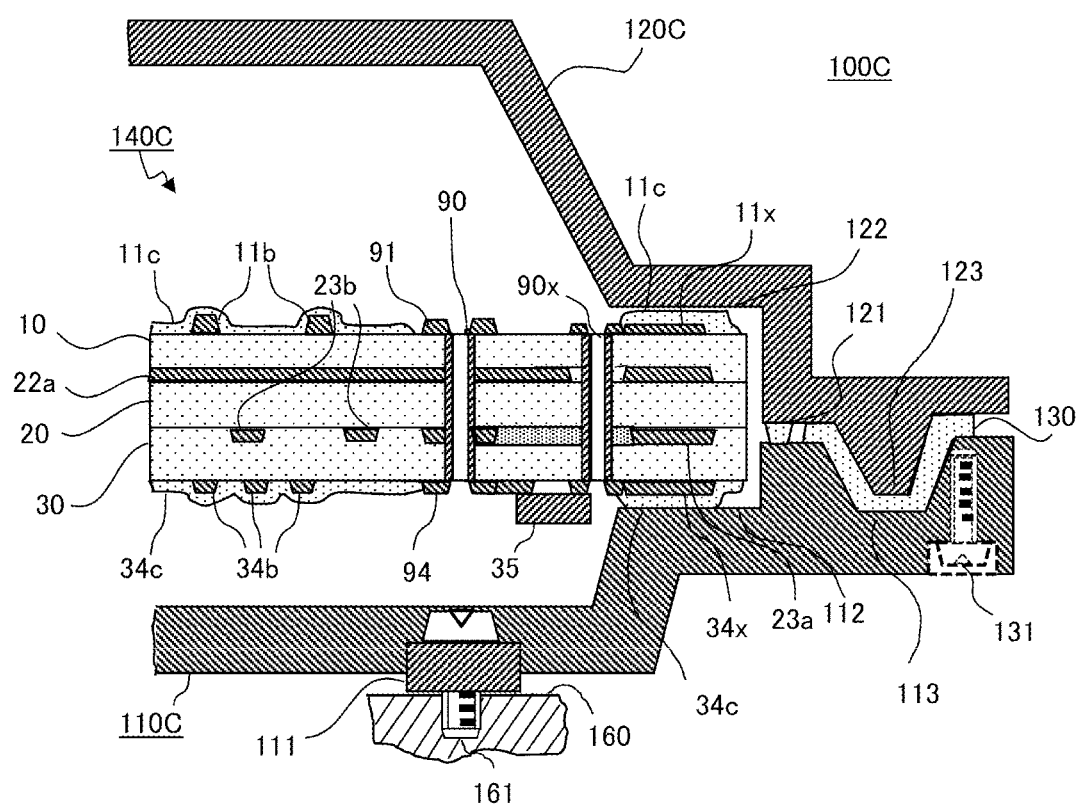
FIG. 7 is a partial cross-sectional view of an in-vehicle electronic device according to Embodiment 3.

The configuration according to Embodiment 3 of the in-vehicle electronic device will be described in detail with reference to FIG. 7 which is a partial cross-sectional view and FIG. 8 which is an exploded perspective view of the circuit board shown in FIG. 7 focusing on differences with that in FIG. 1 and FIG. 2. In the drawings, the same reference numerals denote the same or corresponding parts, the in-vehicle electronic device 100A is replaced with an in-vehicle electronic device 100C, and Embodiments are classified with capital letters at ends of the reference numerals. In FIGS. 7 and 8, a main difference with FIGS. 1 and 2 is that a metal cover 120C is used instead of the resin cover 120A, and mounting of a base 110C is described collectively for both cases of conductive mounting and insulation mounting on the vehicle body. Accordingly, the solder resist film 34c (in the case of FIG. 7) and the solder film 39 (in the case of FIG. 8) are mixed in the selection layer for the outer frame protection pattern 34x, however, an actual product is specified as either one.

In accordance with use of the metal cover 120C, an outer frame protection pattern 11x is used instead of the first annular ground pattern 11a, and similarly to the fourth layer outer frame protection pattern 34x, the solder resist film 11c (in the case of FIG. 7) and a solder film 19 (in the case of FIG. 8) are mixed in the first layer outer frame protection pattern 11x, however, the actual product is specified as either one. However, actually as shown in FIG. 8, the solder films 19 for the first layer outer frame protection pattern 11x are distributedly provided in a plurality of portions of the outer frame protection pattern 11x for the three directions, and the solder resist film 11c as the rustproofing treatment is applied to portions other than the solder film 19. Similarly, the solder film 39 for the fourth layer outer frame protection pattern 34x is distributedly provided in the plurality of portions of the outer frame protection pattern 34x, and the solder resist film 34c as the rustproofing treatment is applied to the portions other than the solder film 39. Note that the first layer outer frame protection pattern 11x and the fourth layer outer frame protection pattern 34x are connected by a protection pattern connection via 90x, and the coupling capacitor 35 is mounted on the fourth layer circuit pattern, however, it may be distributedly connected on the first layer circuit pattern.

Figure 9A:
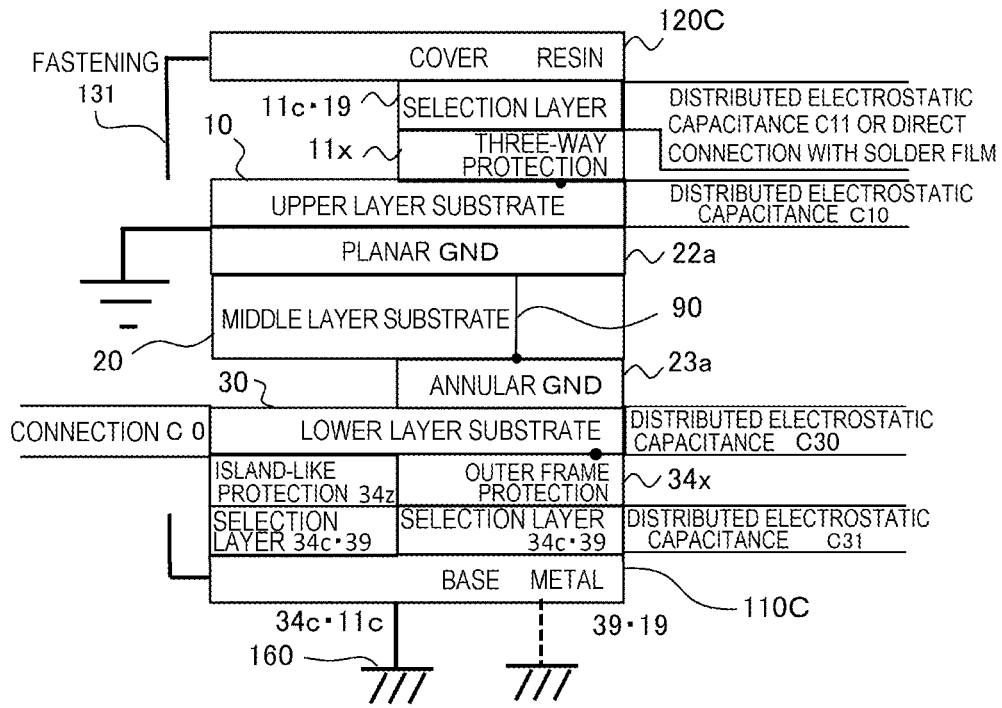
FIG. 9A is a layered configuration diagram of the circuit board shown in FIG. 7.
Figure 9B:
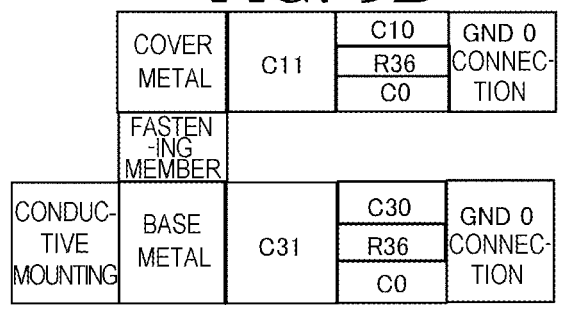
FIG. 9B is a connection circuit diagram of a capacitor at the time of conductive mounting according to Embodiment 3 shown in FIG. 7.

Next, with respect to FIG. 9A which is a laminated configuration diagram of the circuit board of the in-vehicle electronic device of FIG. 7, FIG. 9B which is a connection circuit diagram of the capacitor at the time of conductive mounting of the in-vehicle electronic device of FIG. 7, and FIG. 9C which is a connection circuit diagram of the capacitor at the time of nonconductive mounting, the action and operation of the in-vehicle electronic device will be described in detail focusing on the differences with FIG. 3A and FIG. 3B. FIGS. 9A and 9B show a case where the metal base 110C is conductively attached to the mounting surface 160, and the outer frame protection pattern 34x provided on the back surface of the lower layer substrate 30 is in contact with the shelf step portion 112 of the base 110C via the solder resist film 34c as the selection layer. The outer frame protection pattern 11x provided on the surface of the upper layer substrate 10 is in contact with the solder resist film 11c as the selection layer and the sandwiching pressure contact portion 122 of the metal cover 120C connected to the base 110C via the fastening member 131. Therefore, between the metal base 110C conductively attached to the vehicle body and the planar ground pattern 22a connected to the reference ground point GND0, the distributed electrostatic capacitance $C_{31}$ connected in series to the parallel circuit of the capacitor made of the coupling capacitors 35 having the total electrostatic capacitance $C_0$, the discharge resistance $R_{36}$, and the distributed electrostatic capacitance $C_{30}$ is disposed.

Similarly, between the metal cover 120C conductively attached to the vehicle body via the metal base 110C and the fastening member 131, and the planar ground pattern 22a connected to the reference ground point GND0, distributed electrostatic capacitance $C_{11}$ connected in series to the parallel circuit of the capacitor made of the coupling capacitors 35 having the total electrostatic capacitance $C_0$, the discharge resistance $R_{36}$, and distributed electrostatic capacitance $C_{10}$ is disposed. However, the distributed electrostatic capacitance $C_{10}$ is formed between the planar ground pattern 22a and the outer frame protection pattern 11x, and the distributed electrostatic capacitance $C_{11}$ is an electrostatic capacitance of the pseudo-capacitor formed between the outer frame protection pattern 11x and the cover 120C. As described above, when the metal base is conductively attached to the vehicle body, by making it nonconductive between the base and the outer frame protection pattern, and between the cover and the outer frame protection pattern by the solder resist film, the base, the cover, and the planar ground pattern are prevented from being connected to each other, when the short circuit abnormality occurs in the coupling capacitor, so as to prevent circulating current from flowing through the wiring paths having different ground potentials.

Figure 9C:
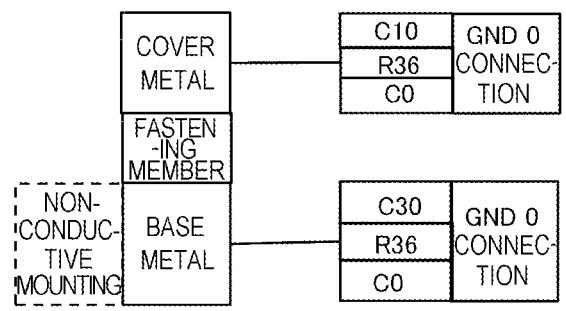
FIG. 9C is a connection circuit diagram of the capacitor at the time of nonconductive mounting according to Embodiment 3 shown in FIG. 7.

FIGS. 9A and 9C show a case where the metal base 110C is non-conductively attached to the mounting surface 160, and the outer frame protection pattern 34x provided on the back surface of the lower layer substrate 30 is in contact with the shelf step portion 112 of the base 110C via the solder film 39 as the selection layer. The outer frame protection pattern 11x provided on the surface of the upper layer substrate 10 is in contact with the sandwiching pressure contact portion 122 of the metal cover 120C connected to the base 110C via the solder film 19 as the selection layer and the fastening member 131. Therefore, between the metal base 110C non-conductively attached to the vehicle body and the planar ground pattern 22a connected to the reference ground point GND0, the parallel circuit of the capacitor made of the coupling capacitors 35 having the total electrostatic capacitance C0, the discharge resistance R36, and the distributed electrostatic capacitance C30 is disposed.

Similarly, between the metal cover 120C integrated with the metal base 110C non-conductively attached to the vehicle body and the planar ground pattern 22a connected to the reference ground point GND0, the parallel circuit of the capacitor made of the coupling capacitors 35 having the total electrostatic capacitance C0, the discharge resistance R36, and the distributed electrostatic capacitance C10 is disposed. Therefore, the potential of the metal base 110C non-conductively attached to the vehicle body is stabilized by the potential of the outer frame protection pattern 34x without being influenced by the potential of the mounting portion. The potential of the outer frame protection pattern 34x is prevented from variation by the parallel circuit of the total electrostatic capacitance C0 of the coupling capacitors 35, the lower layer protection distributed electrostatic capacitance C30, and the discharge resistance R36, which are connected between the base and the planar ground pattern 22a. Similarly, the potential of the metal cover 120C non-conductively attached to the vehicle body is stabilized by the potential of the outer frame protection pattern 11x without being influenced by the potential of the mounting portion. The potential of the outer frame protection pattern is prevented from variation by the parallel circuit of the total electrostatic capacitance C0 of the coupling capacitors 35, an upper layer protection distributed electrostatic capacitance C10, and the discharge resistance R36, which are connected between the cover and the planar ground pattern 22a.

As is apparent from the above description, the in-vehicle electronic device 100C according to Embodiment 3 includes the metal base 110C including the mounting and fixing portion 111 fixed to the mounting surface 160 of the vehicle, the metal cover 120C integrated with the base 110C by the fastening member 131, and a multilayer circuit board 140C sandwiched between the shelf step portion 112 provided inside the base 110C and the sandwiching pressure contact portion 122 provided inside the cover 120C. In the in-vehicle electronic device 100C, the end surface of the connector housing 150 mounted on the first side of the multilayer circuit board 140C is disposed so as to be exposed from the housing constituted by the base 110C and the cover 120C, and the plurality of connection terminals 151 to which the power supply line and the input/output signal line are connected is press-fitted to the connector housing 150. The multilayer circuit board 140C has the first to the fourth layer circuit patterns laminated via the plurality of insulating substrates, the first layer circuit pattern faces the inner surface of the cover 120C, the fourth layer circuit pattern faces the inner surface of the base 110C, both the first layer circuit pattern and the fourth layer circuit pattern serve as the mounting surfaces for the circuit components, and the wiring patterns between the circuit components are provided thereon. The planar ground pattern 22a connected to the reference ground point GND0 of the vehicle body via the ground terminal GND which is the part of the plurality of connection terminals 151 is provided in the second layer circuit pattern.

The annular ground pattern 23a connected to the planar ground pattern 22a via the plurality of ground vias 90 is provided in the third layer circuit pattern. In the fourth layer circuit pattern, one or a plurality of divided fourth layer outer frame protection patterns 34x is provided in the entire area or the partial area of outer frame positions of the four sides of the multilayer circuit board 140C, or in the entire area or the partial area of the outer frame positions of the three sides other than the first side. The first layer circuit pattern includes the first layer outer frame protection pattern 11x connected to the fourth layer outer frame protection pattern 34x via a plurality of protection pattern connection vias 90x. The fourth layer or the first layer outer frame protection pattern 34x, 11x is connected to the planar ground pattern 22a via one or a plurality of coupling capacitors 35, and is in contact with the shelf step portion 112 provided in the base 110C or the sandwiching pressure contact portion 122 provided in the cover 120C via the nonconductive or the conductive intervening layer which is the solder resist films 34c, 11c or the solder films 39, 19. Half or more than half of each of all pattern widths of the annular ground pattern 23a and the outer frame protection patterns 34x, 11x three-dimensionally overlap the outer frame portion of the planar ground pattern 22a.

Therefore, it is possible to easily deal with the difference in various installation conditions by selecting the intervening layer, and in either case the outer frame protection pattern and the planar ground pattern are not directly connected, so that the planar ground pattern is not directly connected to the two types of ground points having different potential levels via the base, thereby preventing generation of the common mode noise. This is the same for other embodiments.

The cover 120C is the metal cover, and the first layer circuit pattern includes the first layer outer frame protection pattern 11x connected to the fourth layer outer frame protection pattern 34x via the plurality of protection pattern connection vias 90x, and is in contact with the sandwiching pressure contact portion 122 provided on the cover 120C via the nonconductive or conductive intervening layer which is the solder resist film 11c or the solder film 19. The intervening layer is the same nonconductive or conductive layer as the intervening layer for the fourth layer outer frame protection pattern 34x.

As described above, in relation to a third aspect, the first layer circuit pattern is provided with the first layer outer frame protection pattern, the first layer outer frame protection pattern is connected to the fourth layer outer frame protection pattern via the plurality of protection pattern connection vias, and is in contact with the sandwiching pressure contact portion provided in the cover via the same nonconductive or conductive intervening layer as the fourth layer outer frame protection pattern. Therefore, when both the base and the cover are made of metal and are conductively attached to the conductive portion of the vehicle body, it is possible to prevent intrusion and emission of the high frequency noise via the base and the cover by using the solder resist film as the intervening layer. Even if both the base and the cover are made of metal, when they are not conductively attached to the conductive portion of the vehicle body, it is possible to prevent intrusion and emission of the high frequency noise via the base and the cover by using the solder film as the intervening layer. In either case, the high frequency noise to the outer frame protection pattern is prevented by the coupling capacitor. When a large heat generating component is mounted on the back surface of the cover, it is necessary to enhance heat dissipation effect by using the metal cover, but in this case, the first layer outer frame protection pattern is effective because it is likely to be affected by the electromagnetic induction noise.

The outer frame protection patterns 34x, 11x provided in the fourth layer or the first layer are provided at three outer peripheral positions of the multilayer circuit board 140C excluding the mounting position of the connector housing 150. The plurality of coupling capacitors 35 connected between the outer frame protection patterns 34x, 11x and the planar ground pattern 22a is provided in one or both of the fourth layer or the first layer circuit pattern. The arrangement interval when all the coupling capacitors 35 are projected is a pitch of one tenth or less of the wavelength λ of the high frequency noise to be reduced. Therefore, it has the same features as that of Embodiments 1 and 2.

The discharge resistance 36 is connected in parallel to the coupling capacitor 35 connected between the outer frame protection patterns 34x, 11x provided on the fourth layer or the first layer and the planar ground pattern 22a. Therefore, it has the same features as that of Embodiments 1 and 2.

The planar ground pattern 22a, the annular ground pattern 23a, and the via land connecting one electrode terminal of the plurality of coupling capacitors 35 are connected to each other via the plurality of ground vias 90, and the other electrode terminal of the plurality of the coupling capacitors 35 is connected to the outer frame protection patterns 34x, 11x of the fourth layer or the first layer. Therefore, it has the same features as that of Embodiments 1 and 2.

The integrated circuit element 11d including the microprocessor is mounted and connected to the first layer circuit pattern, and the planar ground pattern 22a is constituted by the second layer circuit pattern adjacent to the mounting surface of the integrated circuit element 11d. The fourth layer or the first layer cutout portion 34y, 11y is provided and divided at a position where the fourth layer or the first layer outer frame protection pattern 34x, 11x approaches the integrated circuit element 11d. At least one of the coupling capacitors 35 is connected between the planar ground pattern 22a and the outer frame protection patterns 34x, 11x for each of the division units of the outer frame protection patterns 34x, 11x, and at least one of the discharge resistances 36 is connected in parallel with the coupling capacitor 35 for each of the division units. When the arrangement interval between the outer frame protection patterns 34x, 11x and the integrated circuit element 11d is equal to or less than the pattern width of the outer frame protection patterns 34x, 11x, the break interval of the outer frame protection patterns 34x, 11x by the cutout portions 34y, 11y is a dimension equal to or more than the pattern width of the outer frame protection pattern 34x, 11x. Therefore, it has the same features as that of Embodiments 1 and 2.

Embodiment 4

Figure 10:
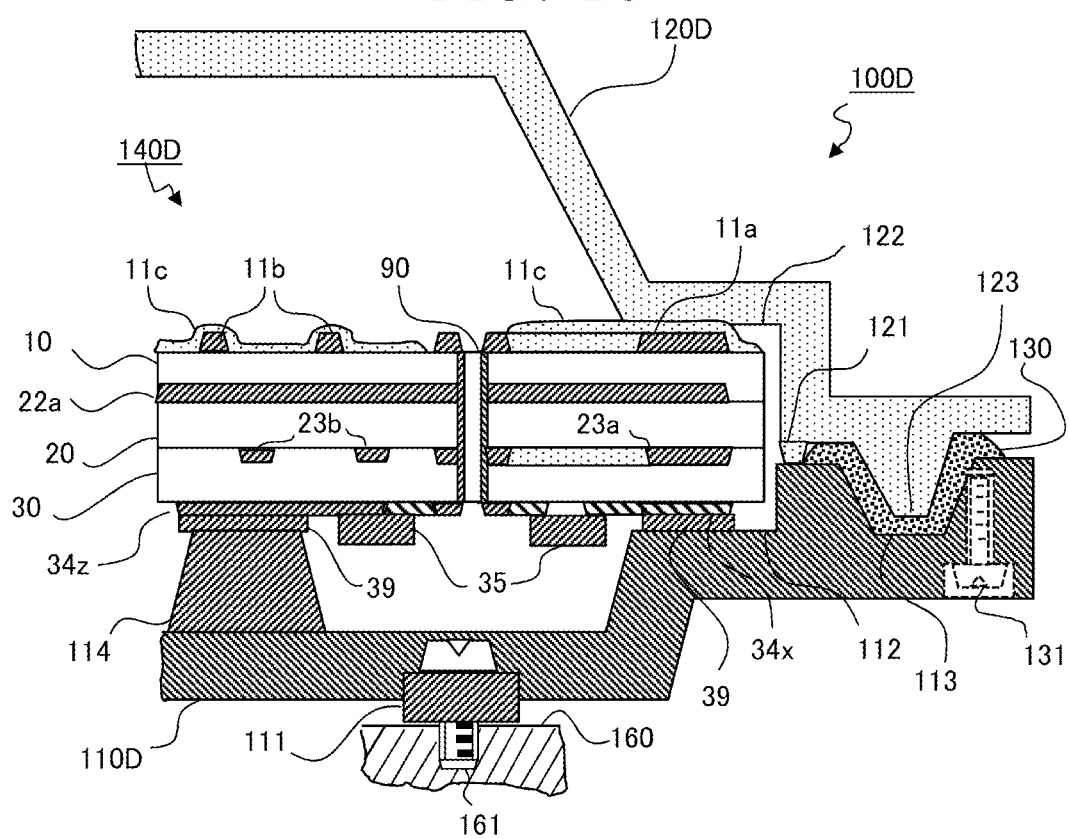
FIG. 10 is a partial cross-sectional view of an in-vehicle electronic device according to Embodiment 4.
Figure 11:
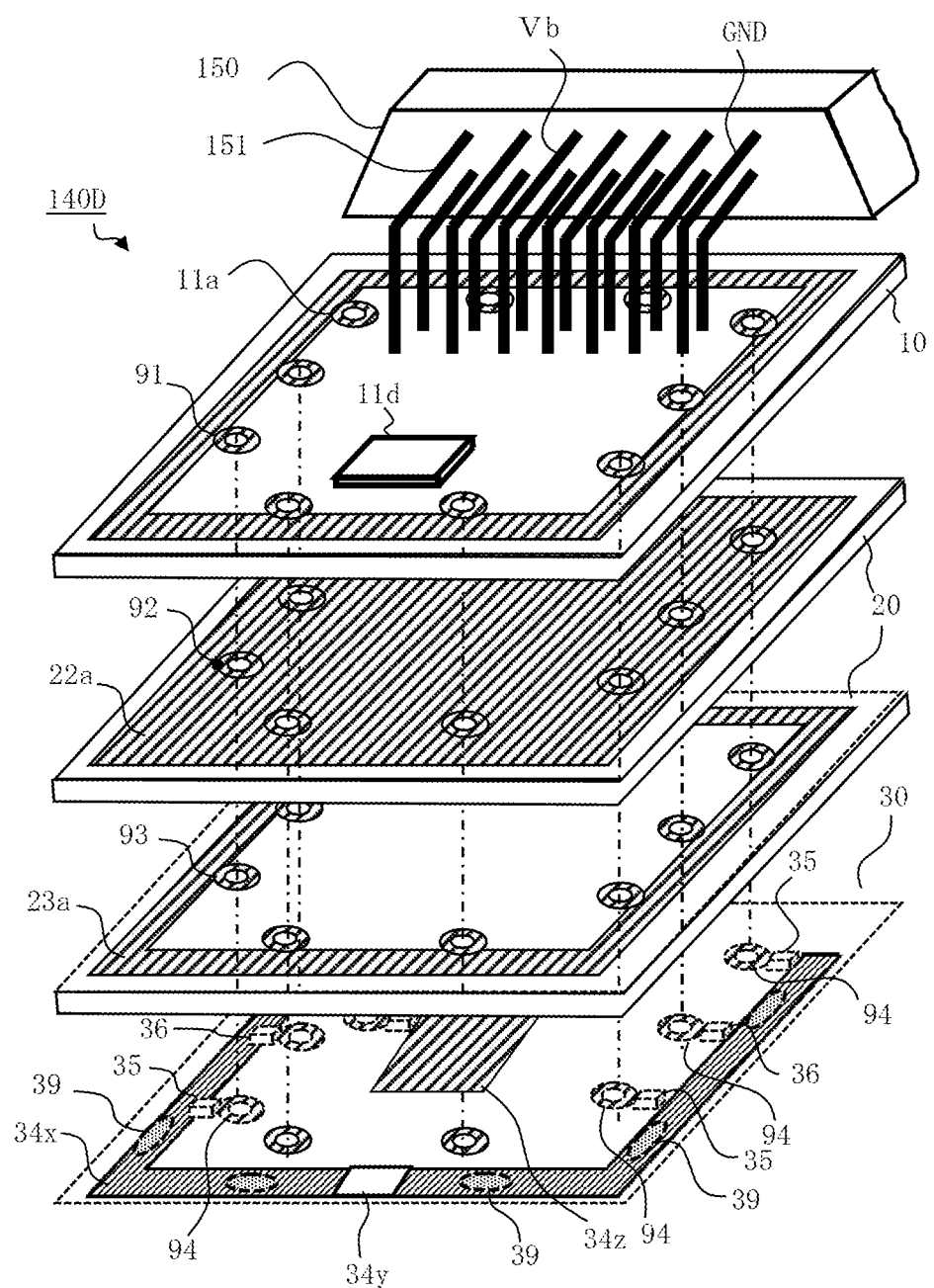
FIG. 11 is an exploded perspective view of a circuit board shown in FIG. 10.

The configuration according to Embodiment 4 of the in-vehicle electronic device will be described in detail with reference to FIG. 10 which is a partial cross-sectional view and FIG. 11 which is an exploded perspective view of the circuit board shown in FIG. 10 focusing on differences with that in FIG. 1 and FIG. 2. In the drawings, the same reference numerals denote the same or corresponding parts, the in-vehicle electronic device 100A is replaced with an in-vehicle electronic device 100D, and Embodiments are classified with capital letters at ends of the reference numerals. In FIGS. 10 and 11, main differences with FIGS. 1 and 2 are that an island-like protection pattern 34z facing a raised portion 114 of a base 110D is provided on the fourth layer circuit pattern, and the solder film 39 or the solder resist film 34c as a selection layer for the island-like protection pattern 34z, the coupling capacitor 35, and the discharge resistance 36 are added. The mounting of the metal base 110D is described collectively for both cases of conductive mounting and insulation mounting on the vehicle body.

Therefore, the solder resist film 34c (in the case of FIG. 12B) and the solder film 39 (in the case of FIG. 12C) are mixed in the selection layer for the outer frame protection pattern 34x and the island-like protection pattern 34z, but the actual product is specified as either one. However, actually as shown in FIG. 11, the solder films 39 for the fourth layer outer frame protection pattern 34x are distributedly provided in the plurality of portions of the outer frame protection pattern 34x for the three directions, and the solder resist film 34c as the rustproofing treatment is applied to the portions other than the solder film 39. Next, with respect to FIG. 12A which is a laminated configuration diagram of the circuit board of the in-vehicle electronic device of FIG. 10, FIG. 12B which is a connection circuit diagram of the capacitor at the time of conductive mounting of the in-vehicle electronic device of FIG. 10, and FIG. 12C which is a connection circuit diagram of the capacitor at the time of nonconductive mounting, the action and operation of the in-vehicle electronic device will be described in detail focusing on the differences with FIG. 3A and FIG. 3B.

Figure 12A:
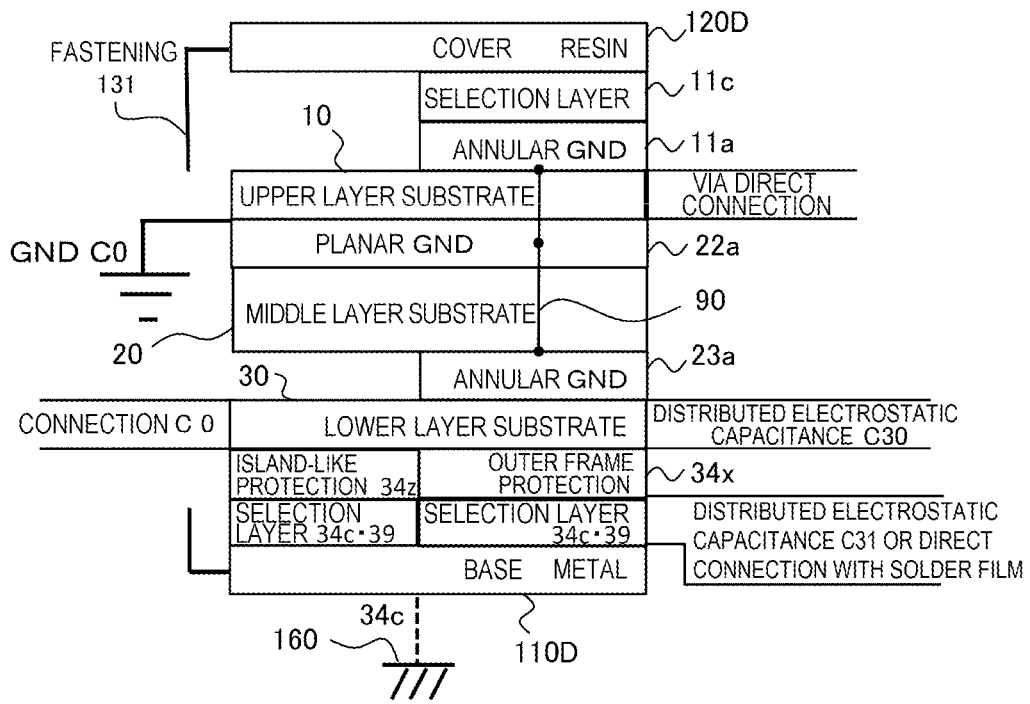
FIG. 12A is a layered configuration diagram of the circuit board shown in FIG. 10.
Figure 12B:
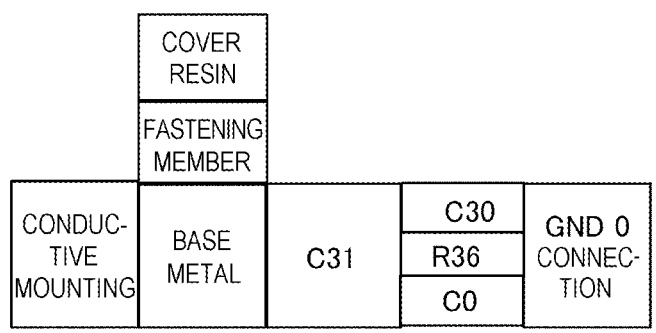
FIG. 12B is a connection circuit diagram of a capacitor at the time of conductive mounting according to Embodiment 4 shown in FIG. 10.

FIGS. 12A and 12B show a case where the metal base 110D is conductively attached to the mounting surface 160, and the outer frame protection pattern 34x and the island-like protection pattern 34z provided on the back surface of the lower layer substrate 30 is in contact with the shelf step portion 112 and the raised portion 114 of the base 110D via the solder resist film 34c as the selection layer. Therefore, between the metal base 110D conductively attached to the vehicle body and the planar ground pattern 22a connected to the reference ground point GND0, the distributed electrostatic capacitance C31 connected in series to the parallel circuit of the capacitor made of the coupling capacitors 35 having the total electrostatic capacitance C0, the discharge resistance R36, and the distributed electrostatic capacitance C30 is disposed. As described above, when the metal base is conductively attached to the vehicle body, by making it nonconductive among the base, the outer frame protection pattern, and the island-like protection pattern by the solder resist film, the base and the planar ground pattern are prevented from being connected to each other, when the short circuit abnormality occurs in the coupling capacitor, so as to prevent circulating current from flowing through the wiring paths having different ground potentials.

Figure 12C:
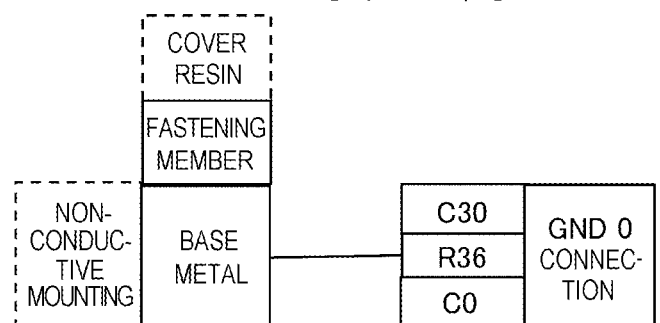
FIG. 12C is a connection circuit diagram of the capacitor at the time of nonconductive mounting according to Embodiment 4 shown in FIG. 10.

FIGS. 12A and 12C show a case where the metal base 110D is non-conductively attached to the mounting surface 160, and the outer frame protection pattern 34x and the island-like protection pattern 34z provided on the back surface of the lower layer substrate 30 is in contact with the shelf step portion 112 of the base 110D via the solder film 39 as the selection layer. Therefore, the potential of the metal base 110D non-conductively attached to the vehicle body is stabilized by the potential of the outer frame protection pattern 34x and the island-like protection pattern 34z without being influenced by the potential of the mounting portion, and the potential is prevented from variation by the parallel circuit of the total electrostatic capacitance C0 of the coupling capacitors 35, the lower layer protection distributed electrostatic capacitance C30, and the discharge resistance R36, which are connected between the base and the planar ground pattern 22a. In a case where a cover 120D is made of metal and the connection terminal 151 by the connector housing 150 is in a direction perpendicular to the circuit board, a depth dimension of the cover 120D is flat, and it is also possible to provide the island-like protection pattern in the first layer circuit pattern by providing the raised portion on the inner surface of the cover 120D similarly to the raised portion 114 on the base 110D side. In this case, the shelf step portion of the base and the sandwiching pressure contact portion of the cover are respectively provided on the outer frame four sides of the base and the cover.

As is apparent from the above description, the in-vehicle electronic device 100D according to Embodiment 4 includes the metal base 110D including the mounting and fixing portion 111 fixed to the mounting surface 160 of the vehicle, a resin cover 120D integrated with the base 110D by the fastening member 131, and a multilayer circuit board 140D sandwiched between the shelf step portion 112 provided inside the base 110D and the sandwiching pressure contact portion 122 provided inside the cover 120D. In the in-vehicle electronic device 100D, the end surface of the connector housing 150 mounted on the first side of the multilayer circuit board 140D is disposed so as to be exposed from the housing constituted by the base 110D and the cover 120D, and the plurality of connection terminals 151 to which the power supply line and the input/output signal line are connected is press-fitted to the connector housing 150. The multilayer circuit board 140D has the first to the fourth layer circuit patterns laminated via the plurality of insulating substrates, the first layer circuit pattern faces the inner surface of the cover 120D, the fourth layer circuit pattern faces the inner surface of the base 110D, both the first layer circuit pattern and the fourth layer circuit pattern serve as the mounting surfaces for the circuit components, and the wiring patterns between the circuit components are provided thereon. The planar ground pattern 22a connected to the reference ground point GND0 of the vehicle body via the ground terminal GND which is the part of the plurality of connection terminals 151 is provided in the second layer circuit pattern.

The annular ground pattern 23a connected to the planar ground pattern 22a via the plurality of ground vias 90 is provided in the third layer circuit pattern. In the fourth layer circuit pattern, one or a plurality of divided fourth layer outer frame protection patterns 34x is provided in the entire area or the partial area of outer frame positions of the four sides of the multilayer circuit board 140D, or in the entire area or the partial area of the outer frame positions of the three sides other than the first side. The first layer circuit pattern includes the first layer annular ground pattern 11a connected to the planar ground pattern 22a via the plurality of ground vias 90. The fourth layer outer frame protection pattern 34x is connected to the planar ground pattern 22a via one or the plurality of coupling capacitors 35, and is in contact with the shelf step portion 112 provided in the base 110D via the nonconductive or the conductive intervening layer which is the solder resist film 34c or the solder film 39. Half or more than half of each of all pattern widths of the annular ground patterns 11a, 23a and the outer frame protection pattern 34x three-dimensionally overlap the outer frame portion of the planar ground pattern 22a.

In a case where the metal base is conductively attached to the vehicle body, since the fourth layer outer frame protection pattern faces and is in contact with the shelf step portion of the base via the nonconductive intervening layer, the base and the planar ground pattern are prevented from being connected, when the short circuit abnormality occurs in the coupling capacitor, so as to prevent the circulating current from flowing through the wiring paths having different ground potentials. In a case where the metal base is nonconductively attached to the vehicle body, if the intervening layer is made to be the conductive solder film, the strip-like distributed electrostatic capacitance as the pseudo-electrostatic capacitance element is generated between the outer frame protection pattern and the base, so that it is possible to prevent the noise intrusion and emission in the relatively high frequency band via the coupling capacitor connected between the outer frame protection pattern and the planar ground pattern.

The fourth layer circuit pattern is provided with the island-like protection pattern 34z located inside the outer frame protection pattern 34x, and the island-like protection pattern 34z is in contact with the raised portion 114 provided on the inner surface of the base 110D via the solder resist film 34c or the solder film 39 as the intervening layer, and is connected to the planar ground pattern 22a via one or the plurality of coupling capacitors 35 and the ground via 90. As described above, in relation to a ninth aspect, the fourth layer circuit pattern includes the island-like protection pattern, the island-like protection pattern is connected to the planar ground pattern via the coupling capacitor, and is in contact with the raised portion provided on the inner surface of the base via the solder resist film or the solder film as the intervening layer. Therefore, it is possible to further prevent high frequency current in the base generated by the radiation noise in cooperation with the outer frame protection pattern provided in the outer frame portion. This is the same for Embodiments 1 to 3, and in the case of Embodiment 3 having the metal cover, it is also possible to provide the island-like pattern opposed to the inner surface of the cover.

Although the present application is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations to one or more of the embodiments.

It is therefore understood that numerous modifications which have not been exemplified can be devised without departing from the scope of the present application. For example, at least one of the constituent components may be modified, added, or eliminated. At least one of the constituent components mentioned in at least one of the preferred embodiments may be selected and combined with the constituent components mentioned in another preferred embodiment.

The invention claimed is:
1. An in-vehicle electronic device comprising:
 a conductive base including a mounting and fixing portion fixed to a mounting surface of a vehicle;
 a nonconductive or conductive cover integrated with the conductive base by a fastening member; and
 a multilayer circuit board sandwiched between a shelf step portion provided inside the conductive base and a sandwiching pressure contact portion provided inside the nonconductive or conductive cover, wherein an end surface of a connector housing mounted on a first side of the multilayer circuit board is disposed so as to be exposed from a housing constituted by the conductive base and the nonconductive or conductive cover,
a plurality of connection terminals to which a power supply line and an input/output signal line are connected is press-fitted to the connector housing,
the multilayer circuit board has at least four layers of circuit patterns laminated via a plurality of insulating substrates, a first layer circuit pattern faces an inner surface of the nonconductive or conductive cover, and a fourth layer circuit pattern faces an inner surface of the conductive base,
one or both of the first layer circuit pattern and the fourth layer circuit pattern serve as a mounting surface of a circuit component, and a wiring pattern of the circuit component is provided thereon,
a planar ground pattern connected to a reference ground point of a vehicle body is provided in one of a second layer circuit pattern and a third layer circuit pattern via a ground terminal which is a part of the plurality of connection terminals,
an annular ground pattern connected to the planar ground pattern via a plurality of ground vias is provided in the other of the second layer circuit pattern and the third layer circuit pattern,
in the fourth layer circuit pattern, one or a plurality of divided fourth layer outer frame protection patterns is provided in an entire area or a partial area of outer frame positions of four sides of the multilayer circuit board, or in an entire area or a partial area of outer frame positions of three sides other than the first side,
the first layer circuit pattern comprises a first layer annular ground pattern connected to the planar ground pattern via the plurality of ground vias, or comprises a first layer outer frame protection pattern connected to the one or the plurality of divided fourth layer outer frame protection patterns via a plurality of protection pattern connection vias,
the one or the plurality of divided fourth layer outer frame protection patterns or the first layer outer frame protection pattern is connected to the planar ground pattern via one or a plurality of coupling capacitors, and is in contact with the shelf step portion provided in the conductive base or the sandwiching pressure contact portion provided in the nonconductive or conductive cover via a nonconductive or conductive intervening layer which is a solder resist film or a solder film, and
half or more than half of each of all pattern widths of the annular ground pattern, the first layer annular ground pattern, the one or the plurality of divided fourth layer outer frame protection patterns, and the first layer outer frame protection pattern overlap an outer frame portion of the planar ground pattern.

2. The in-vehicle electronic device according to claim 1, wherein the nonconductive or conductive cover is a nonconductive cover, the first layer circuit pattern comprises the first layer annular ground pattern connected to the planar ground pattern via the plurality of ground vias, and the annular ground pattern is in contact with the sandwiching pressure contact portion via the solder resist film.

3. The in-vehicle electronic device according to claim 1, wherein the nonconductive or conductive cover is a conductive cover, the first layer circuit pattern comprises the first layer outer frame protection pattern connected to the one or the plurality of divided fourth layer outer frame protection patterns via the plurality of protection pattern connection vias, and is in contact with the sandwiching pressure contact portion via the nonconductive or conductive intervening layer which is the solder resist film or the solder film, and the intervening layer is the same nonconductive or conductive layer as the intervening layer with respect to the one or the plurality of divided fourth layer outer frame protection patterns.

4. The in-vehicle electronic device according to claim 1, wherein the one or the plurality of divided fourth layer outer frame protection patterns or the first layer outer frame protection pattern is provided at positions of three sides of an outer periphery of the multilayer circuit board excluding a mounting position of the connector housing, the one or the plurality of coupling capacitors connected between the outer frame protection pattern and the planar ground pattern is provided in one or both of the fourth layer circuit pattern and the first layer circuit pattern, and an arrangement interval when all of the one or the plurality of coupling capacitors are projected is a pitch of one tenth or less of a wavelength of high frequency noise to be reduced.

5. The in-vehicle electronic device according to claim 1, wherein a discharge resistance is connected in parallel to the one or the plurality of coupling capacitors connected between the one or the plurality of divided fourth layer outer frame protection patterns or the first layer outer frame protection pattern and the planar ground pattern.

6. The in-vehicle electronic device according to claim 1, wherein the planar ground pattern, the annular ground pattern, and a via land connecting one electrode terminal of the one or the plurality of coupling capacitors are connected to each other via the plurality of ground vias, and the other electrode terminal of the one or the plurality of coupling capacitors is connected to the one or the plurality of divided fourth layer outer frame protection patterns or the first layer outer frame protection pattern.

7. The in-vehicle electronic device according to claim 1, wherein
an integrated circuit element including a microprocessor is mounted on one of the first layer circuit pattern and the fourth layer circuit pattern,
the planar ground pattern is constituted by the second layer circuit pattern adjacent to the mounting surface of the integrated circuit element or the third layer circuit pattern,
at a position where the one or the plurality of divided fourth layer outer frame protection patterns or the first layer outer frame protection pattern approaches the integrated circuit element, a fourth layer cutout portion or a first layer cutout portion is provided and divided, at least one of the one or the plurality of coupling capacitors is connected between the planar ground pattern and each of division units of the one or the plurality of divided fourth layer outer frame protection patterns, and at least one discharge resistance is connected in parallel to the at least one of the one or the plurality of coupling capacitors for each of the division units, and
when an arrangement interval between the one or the plurality of divided fourth layer outer frame protection patterns and the integrated circuit element is equal to and less than a pattern width of the one or the plurality of divided fourth layer outer frame protection patterns, a break interval of the one or the plurality of divided fourth layer outer frame protection patterns by the cutout portion is a dimension equal to or more than a pattern width of the one or the plurality of divided fourth layer outer frame protection patterns.

8. The in-vehicle electronic device according to claim 1, wherein the second layer circuit pattern and the third layer circuit pattern are formed on both surfaces of a middle layer substrate, the middle layer substrate is an insulating substrate having a thickness dimension for securing a substrate strength, the first layer circuit pattern and the fourth layer circuit pattern are respectively formed on a surface of an upper layer substrate and a back surface of a lower layer substrate, and thickness dimensions of the upper layer substrate and the lower layer substrate are each one half or less of that of the middle layer substrate.

9. The in-vehicle electronic device according to claim 1, wherein an island-like protection pattern located inside the one or the plurality of divided fourth layer outer frame protection patterns is provided in the fourth layer circuit pattern, and the island-like protection pattern is in contact with an elevated portion provided on the inner surface of the conductive base via the solder resist film or the solder film as the intervening layer, and is connected to the planar ground pattern via the one or the plurality of coupling capacitors and the ground vias.

* * * * *